United States Patent
Komatsu et al.

[11] Patent Number: 5,965,209
[45] Date of Patent: Oct. 12, 1999

[54] LIQUID APPLICATION METHOD AND APPLICATION APPARATUS

[75] Inventors: Takayasu Komatsu; Shunji Miyakawa; Kazuo Watanabe, all of Tokyo-to, Japan

[73] Assignee: Dai Nippon Printing Co., Ltd., Japan

[21] Appl. No.: 08/893,095

[22] Filed: Jul. 15, 1997

Related U.S. Application Data

[62] Continuation of application No. 08/603,204, Feb. 20, 1996, abandoned, which is a continuation of application No. 08/374,695, filed as application No. PCT/JP94/00845, May 27, 1994, abandoned.

[30] Foreign Application Priority Data

May 27, 1993 [JP] Japan ................................ 5-146757

[51] Int. Cl.$^6$ .................................. B05D 1/26; B05C 3/18
[52] U.S. Cl. ........................ 427/430.1; 427/165; 427/169; 427/434.3; 118/410; 118/421; 118/DIG. 12
[58] Field of Search .............................. 427/434.3, 434.5, 427/430.1, 165, 169; 118/410, 421, DIG. 12

[56] References Cited

U.S. PATENT DOCUMENTS

| | | | |
|---|---|---|---|
| 2,046,596 | 7/1936 | Zwiebel | 91/43 |
| 2,598,908 | 6/1952 | Grimson | 118/401 |
| 5,044,542 | 9/1991 | Deambrosio | 118/421 |
| 5,206,056 | 4/1993 | Shibata et al. | 427/356 |
| 5,270,079 | 12/1993 | Bok | 427/429 |
| 5,455,062 | 10/1995 | Muhlfriedel et al. | 427/8 |

FOREIGN PATENT DOCUMENTS

| | | |
|---|---|---|
| 505894 | 9/1992 | European Pat. Off. . |
| 59-171958 | 9/1984 | Japan . |
| 6-7727 | 1/1994 | Japan . |
| 2 098 510 | 11/1982 | United Kingdom . |

*Primary Examiner*—Katherine A. Bareford
*Attorney, Agent, or Firm*—Parkhurst & Wendel, L.L.P

[57] ABSTRACT

In an apparatus and method for forming an applied layer of a photosensitive resin on a large glass substrate for an LCD color filter, a substrate (S) is suctioned and held by a movable holder (8) with a main surface thereof to be processed oriented downward. The movable holder (8) is at an angle of inclination ($\theta$) to the horizontal and is capable of moving along a guide rail (7). An application head (H) having an upward-pointing linear slit (13) through which an application liquid is supplied is provided below a region through which the substrate (S) moves supported by the holder (8). When the substrate (S) having a constant clearance ($I_2$) with the application head (H) is moved diagonally upward, an application liquid bead (B) is formed between the slit (13) and the downward-pointing main surface of the substrate (S), by surface tension. The application liquid bead (B) is moved gradually diagonally downward along the main surface of the substrate to form an application layer (Ra). A meniscus ($L_2$) of the application liquid bead (B) facing the higher side of the substrate (S) has a height dimension ($h_2$) that is greater than that of a meniscus ($L_1$) thereof facing the lower side of the substrate, and the height dimension of the meniscus on the higher side of the substrate (S) is made to be sufficiently larger than the thickness of the application liquid layer. This suppresses the generation of shear forces caused by differences in tension force within the application liquid bead (B) created by unevenness in the substrate surface, and thus a uniform applied layer can be formed stably and at a high usage efficiency of application liquid, without being affected by unevenness in the main surface of the substrate.

7 Claims, 21 Drawing Sheets

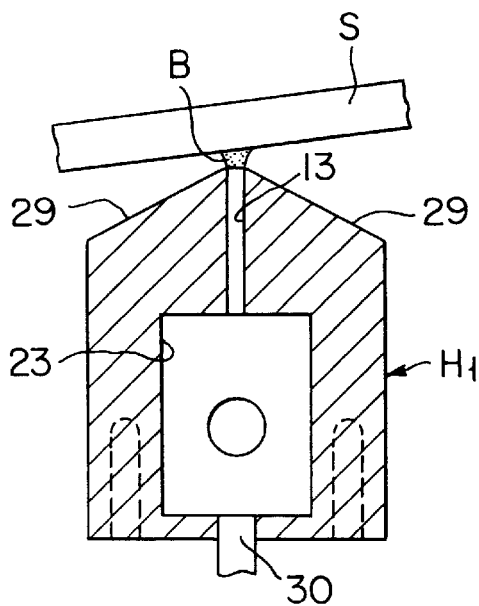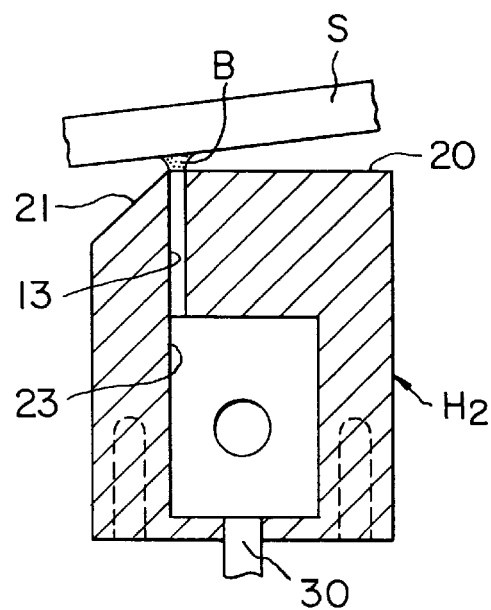
FIG. 14　　　　　　FIG. 16
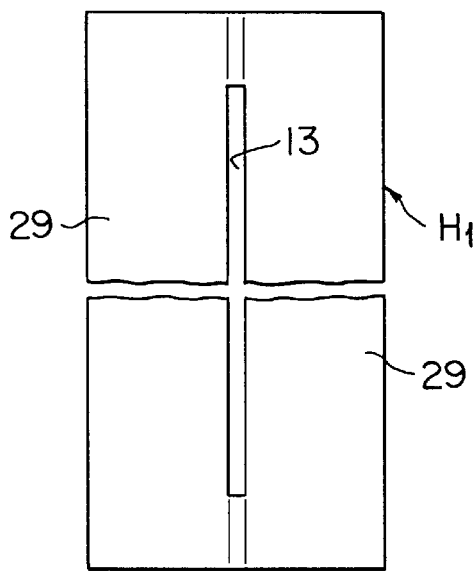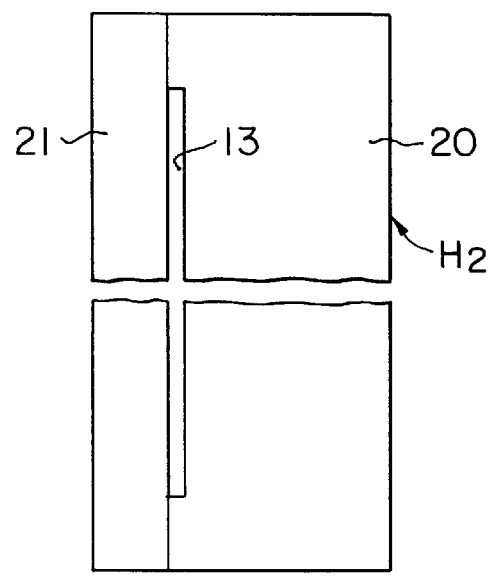
FIG. 15　　　　　　FIG. 17

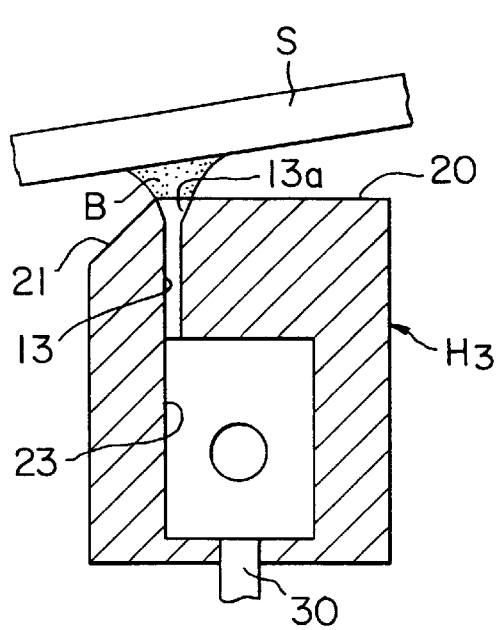
F I G. 18
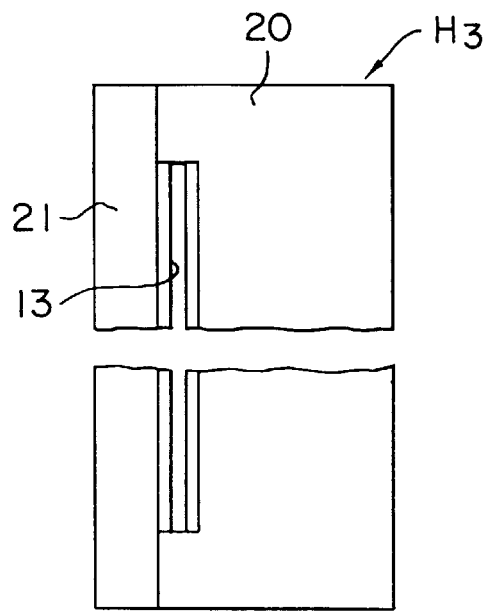
F I G. 19
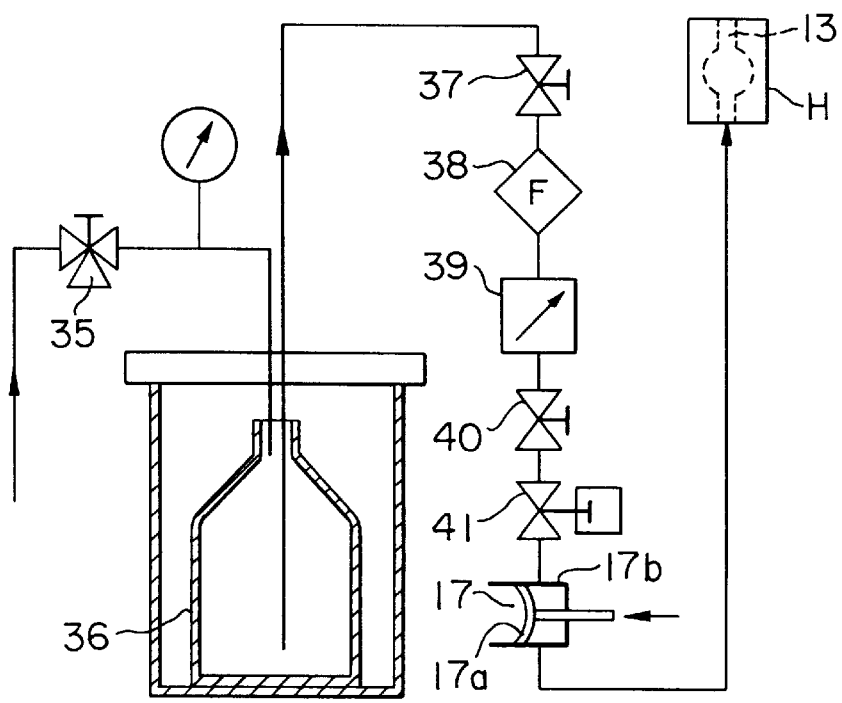
F I G. 20

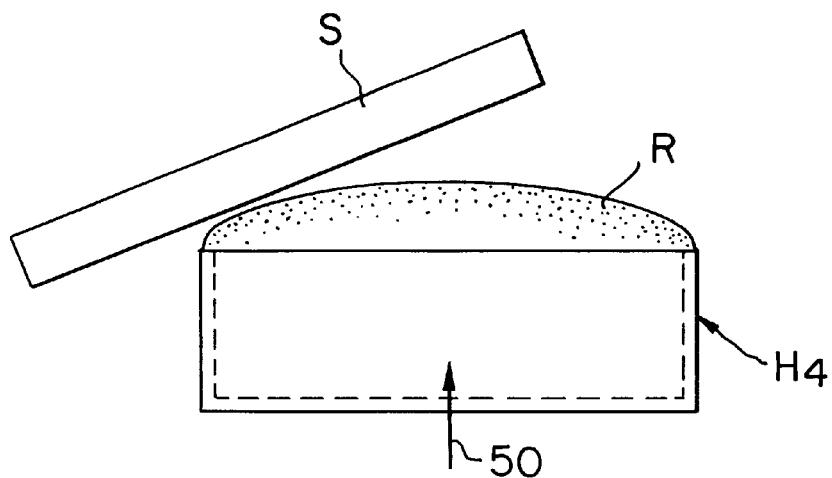
F I G. 21
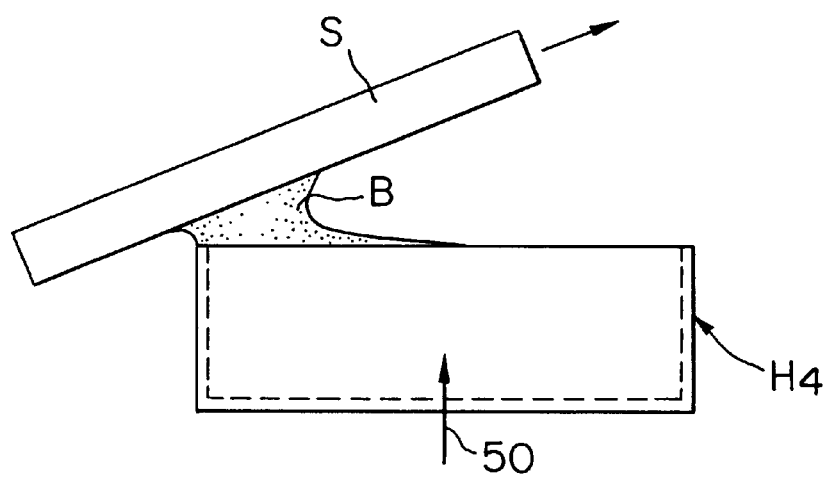
F I G. 22
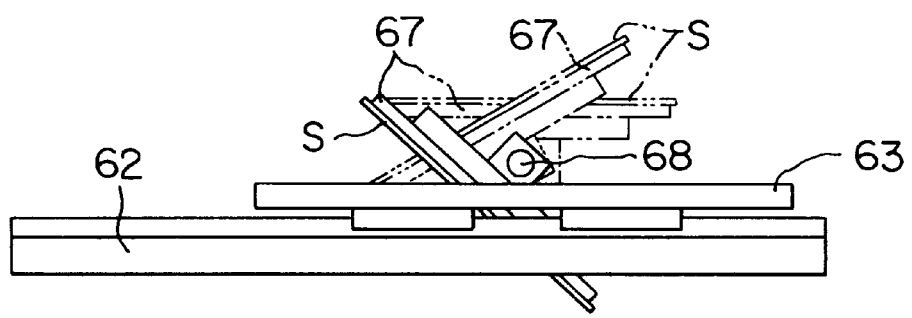
F I G. 23

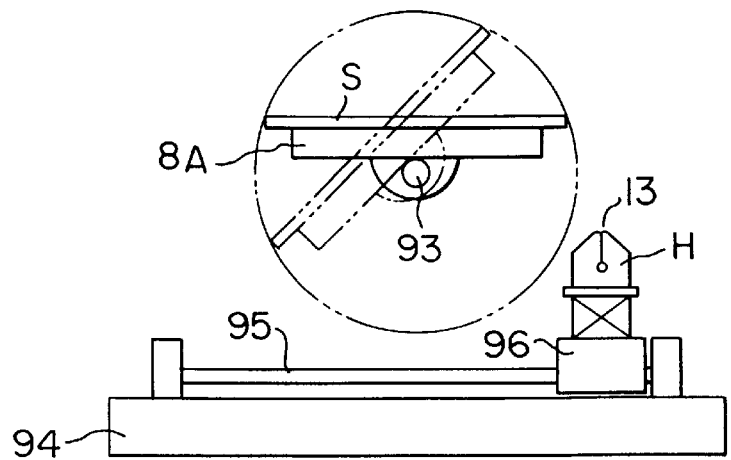
F I G. 32
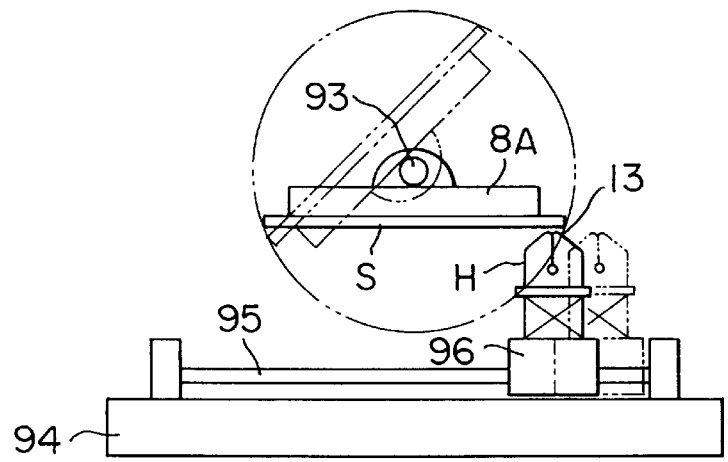
F I G. 33
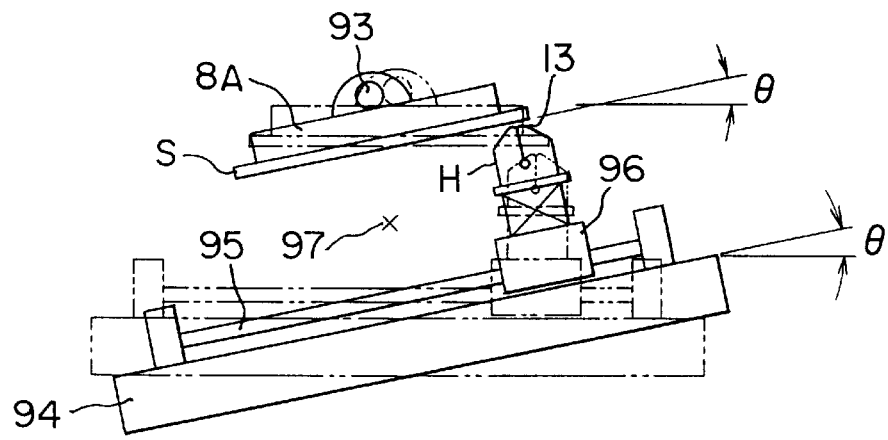
F I G. 34

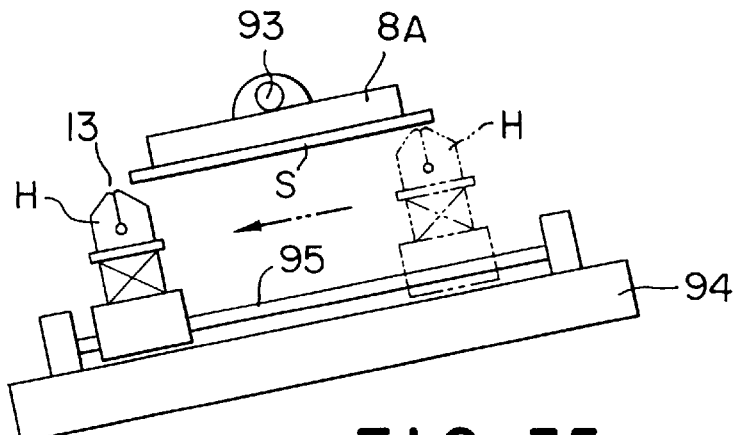
F I G. 35
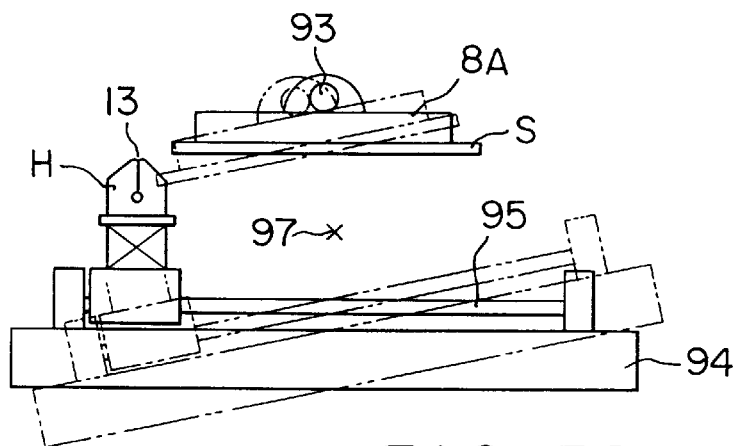
F I G. 36
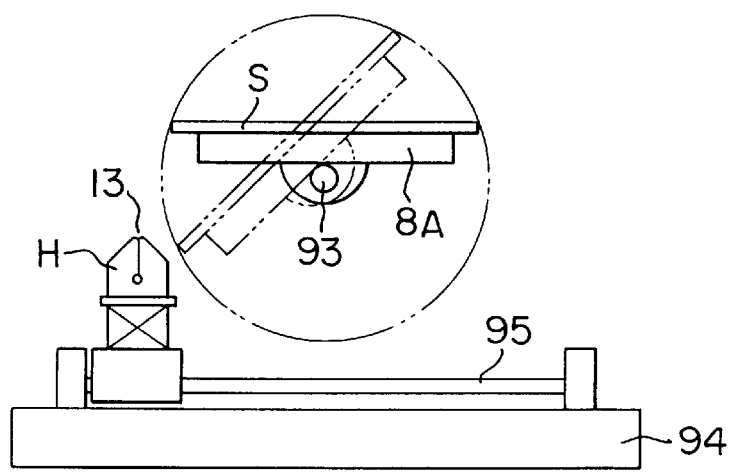
F I G. 37

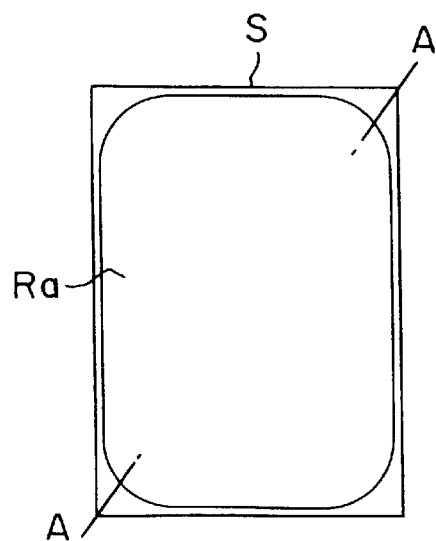
F I G. 40
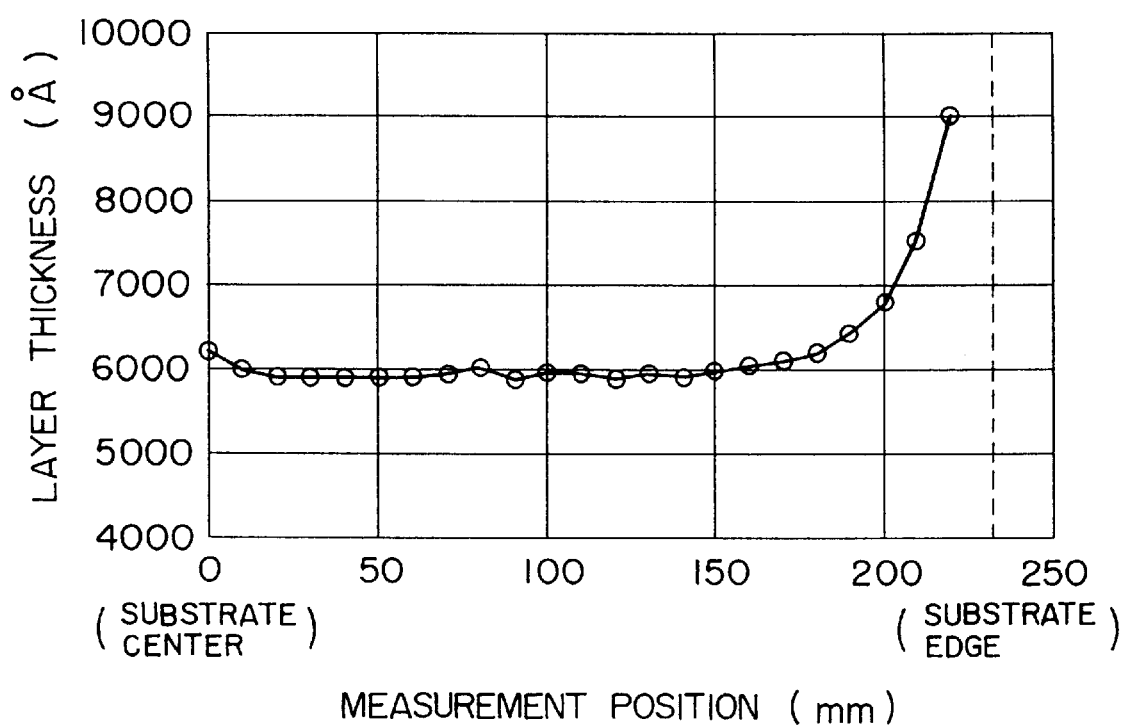
F I G. 41

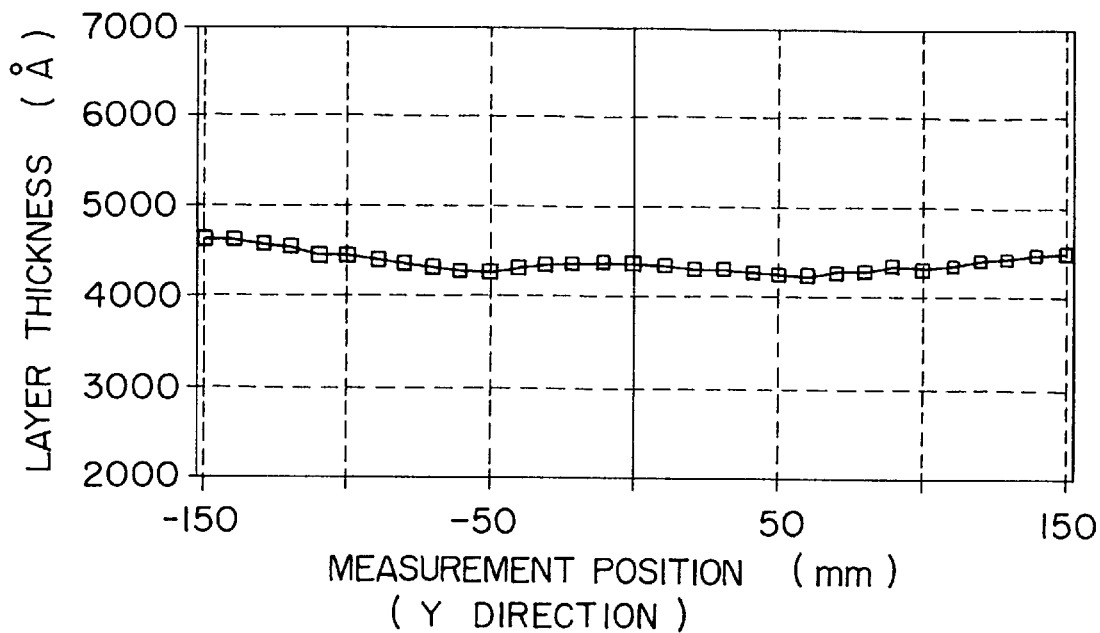
F I G. 43 A
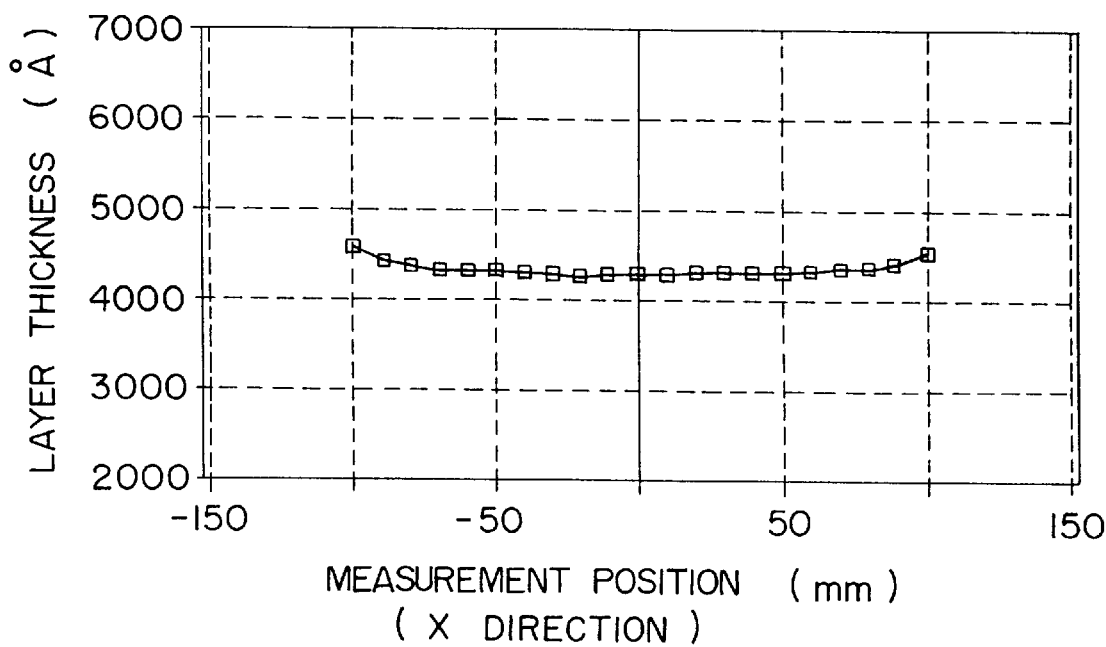
F I G. 43 B

LIQUID APPLICATION METHOD AND APPLICATION APPARATUS

This is a Continuation of application Ser. No. 08/603,204 filed Feb. 20, 1996, now abandoned, which in turn is a continuation of application Ser. No. 08/374,695, filed Jan. 25, 1995, now abandoned, which is a national stage application of PCT/JP94/00845, filed May 27, 1994.

TECHNICAL FIELD

The present invention relates to a method and apparatus for applying an application liquid to sheet-like separate substrates such as large glass substrates typified by color filters for an LCD.

BACKGROUND ART

A spin coating method is often used in the prior art as a method of coating an application liquid over sheet-like separate substrates such as large glass substrates typified by color filters for an LCD. Among spin coating methods, there is a method open to the atmosphere and a sealed cup method, but each of these methods has a low application efficiency of approximately 10% and moreover they have a disadvantage that the applied layer at corner portions of the substrate is too thick, and it has been pointed out that there will be problems concerning factors such as the amount of application liquid used, the layer thickness distribution, and the throughput as substrate sizes are expected to get larger in the future.

A knife coating method, a roll coating method, and a die coating method are available as methods capable of solving the above faults of the spin coating method. Each of these methods provides a clearance (gap) for application above the substrate on which the liquid is to be applied, the value thereof determines the application layer thickness, and smoothness is obtained for the application surface, but if the smoothness (degree of unevenness) of the substrate surface has a value greater than the accuracy of the application, it is difficult to achieve a uniform layer thickness by using any of these methods.

A dip coating method is generally known as an application method that is hardly affected by unevenness of the substrate surface, but it is difficult to avoid coating the non-application portions thereof and electively coat only the main surface of the substrate with this method. A liquid application method is known as a method with application principles that resemble those of the dip coating method and which also selectively coats only the main surface, as stated on page 336 of "Latest Advances in Coating Techniques," edited by Mr. Yuji Harasaki and published by Kabushiki Kaisha Sogo Gijyutu Center, Japan on Apr. 30, 1988. With this method, application liquid is supplied in substantially the horizontal direction through a die head or slide coating die, as will be described below. Liquid adjacent to a lip on the side surface of the die head or sliding die is moved in a direction perpendicular to the substrate that is to be coated. The application liquid supplied from the die head or sliding die forms an application liquid bead between the substrate and the die lip, and an applied layer of the liquid is formed on the main substrate surface in accordance with the upward movement of the substrate.

The above described application method is generally used as an application method for continuous band-shaped substrates. The thickness of the layer to be applied is determined by the relative speed of the substrate and the application head, and the viscosity of the application liquid. In other words, the application liquid pulled up from the bead portion droops down along the substrate under the force of gravity, and the thickness of the layer is determined by a balance between the speed at which the bead portion droops and the speed at which the substrate draws up the application liquid. This application principle is extremely similar to that of the dip coating method. However, if the application liquid has a low viscosity and a weak surface tension, it is difficult with this application method to form a bead in the clearance (gap) provided between the substrate and the application head and thus the application liquid is likely to fall under the force of gravity, without forming a bead, immediately after it is supplied, so that the clearance (gap) between the substrate and application head must be made extremely small in order to prevent these problems. However, with a substrate in which the degree of flatness is low with bumps of up to 100 µm, such as a glass substrate used for an LCD color filter, differences in pull strength caused while the liquid is being pulled from the bead will occur, and thus differing shear forces will act on the liquid bead. If such locally differing shear forces are present, the thickness of the liquid layer drawn out from the liquid bead will not be uniform.

With this liquid application method, continuous liquid application to the main surfaces of substrates is possible. However, the main surfaces of the substrates extend vertically and liquid is supplied from the application head in a perpendicular manner with respect to the substrates, so that in the case of separate substrates, application liquid remaining in the bead portion will droop under the force of gravity as the edge portion of each substrate moves away immediately after the application. Furthermore, the drooping liquid flows around the edge portion of the substrate, reaching the rear surface thereof and the lower portion of the application head with resultant pollution. Therefore, this application method is not suited to application to separate sheet-like substrates.

Even further, the previously described liquid application method using a sliding die has the same defects as the above described liquid application method using an application head. In particular, with this method, the free flow of the application liquid leads to it flowing over the inclined surface of the sliding die and, since the application liquid bead is formed between it and the surface of the substrate, it is difficult to stop the supply at any desired point after the application. For this reason, this application method is not suitable for repeated application in sequence on separate substrates.

This invention is intended to solve the above problems with prior art techniques, and has as its objective the provision of a liquid application method and liquid application apparatus that can highly efficiently form a uniform liquid application layer in a stable state on a surface of a sheet-like separate substrate, irrespective of the properties of the liquid.

SUMMARY OF THE INVENTION

The present invention relates to a liquid application method in which an application liquid is supplied from a horizontal linear application liquid supply means of an application head, a linear or belt-shaped application liquid bead is formed in a space before a substrate positioned in the vicinity of the application liquid supply means, the substrate is moved relatively upward with respect to the application liquid bead across the direction of the application liquid bead, the application liquid bead formed while the application liquid is supplied from the application liquid supply means is brought gradually into contact with a main application surface of the substrate in accordance with the relative movement of the substrate, and thus an applied layer is formed on the main application surface. The application liquid supply means is provided upward, a substantially flat-plate-shaped substrate is used as the substrate, the relative position of the substrate and application head is determined in such a manner that the application liquid supply means of the application head is positioned in the vicinity of a lower surface at an uppermost edge of the inclined substrate before the start of application, a meniscus of the application liquid bead facing the higher side of the substrate in the space between the application liquid supply means and the lower surface of the substrate has a height dimension that is greater than that of a meniscus facing a lower side of the substrate, and the substrate and the application head are moved relatively in such a manner that the application liquid bead moves toward a lowermost edge of the substrate, in a state wherein the above imensional relationship is maintained.

An apparatus of the present invention, which implements the above liquid application method, relates to a liquid application apparatus comprising an application head having a linear application liquid supply means in a horizontal direction, means for supplying an application liquid to the application head, and means for positioning and moving the application head and the substrate relative to one another in such a manner that a linear or belt-shaped application liquid bead is formed between the application head and a main application surface of the substrate; wherein the liquid application apparatus further comprises means for supplying application liquid upward to the application liquid supply means, substrate support means for supporting a substantially flat-plate-shaped substrate in such a manner that the substrate is in an inclined state, with an adjustable angle of inclination, and a main application surface on a lower side of the substrate is exposed downward; and movement means for moving the substrate and the application head in a relative manner such that the substrate is moved relatively across the application liquid supply means of the application head, while the application liquid bead is maintained in a state such that a meniscus thereof facing a higher side of the substrate has a height dimension greater than that of a meniscus facing a lower side of the substrate.

BRIEF DESCRIPTION OF THE DRAWINGS

FIG. 14 is a cross sectional view of a modification of the application head;

FIG. 15 is a plan view of the same;

FIG. 16 is a cross sectional view of another modification of the application head;

FIG. 17 is a plan view of the same;

FIG. 18 is a cross sectional view of a further modification of the application head;

FIG. 19 is a plan view of the same;

FIG. 20 is a piping diagram for the application liquid supply system;

FIG. 21 is a view of a modification of the application head;

FIG. 22 is a view of a state at the start of liquid application by the application head of FIG. 21;

FIG. 23 is a partial side view of a modification of the liquid application apparatus;

FIG. 32 is a side view of another embodiment of a liquid application apparatus in accordance with the present invention;

FIGS. 33, 34, 35, 36, and 37 are sequential explanatory views of the operation of the liquid application apparatus of FIG. 32;

FIG. 40 is a plan view of a liquid-applied substrate obtained by spin coating;

FIG. 41 is a graph of layer thickness distribution taken along the line A—A of the substrate shown in FIG. 40;

FIG. 43A and FIG. 43B are graphs of layer thickness distribution taken in two different directions of the applied layer on a substrate obtained by Example 2 of the present invention;

BEST MODES FOR CARRYING OUT THE INVENTION

Embodiments of the present invention will now be described with reference to the drawings.

Figure 1:
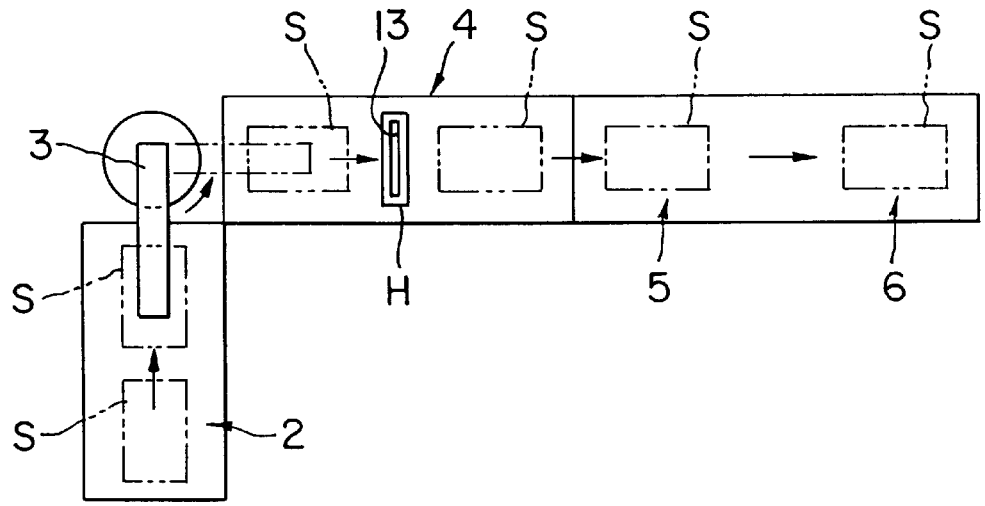
FIG. 1 is a plan view of the layout of a liquid application apparatus in accordance with the present invention.

In FIG. 1, which is a plan view of the layout of a liquid application apparatus in accordance with the present invention, an individual sheet-like substrate S that is to undergo application processing is transferred into a loader unit 2, and is transferred to a liquid application unit 4 by a handling robot 3 where it undergoes liquid application. After the liquid application, each substrate S is dried in a drying unit 5, then is transferred to an unloading unit 6 and is conveyed to the outside.

The individual sheet-like substrate S that is subjected to the liquid application processing of the present invention is typically a large glass substrate for an LCD color filter, and the liquid to be applied to the substrate is a photosensitive resin for forming a fine pattern on the glass substrate. A glass substrate is not flexible, but the substrate processed by the present invention is not limited to such a glass substrate; it could be of a material such as plastic, metal, or paper, and the substrate itself could be flexible. Further, various types of liquid such as a water-based or solvent-based liquid could be used as the liquid to be applied, and pigments, dyestuffs, fillers, sensitizers, resins, and additives could be used either independently or mixed in combination.

Figure 2:
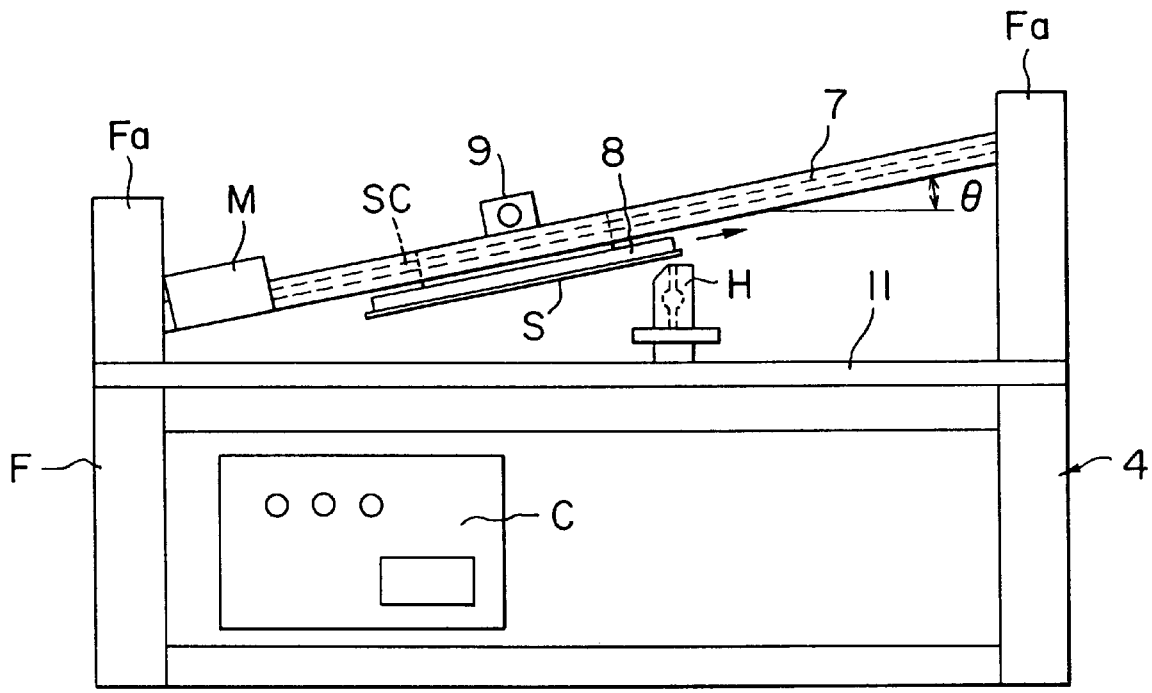
FIG. 2 is a side view of the liquid application unit of the liquid application apparatus of FIG. 1.

A side view of an example of the liquid application unit 4 is shown in FIG. 2. The liquid application unit 4 has a support frame F and a control portion C is provided within the support frame F. Linear guide rails 7 are provided in an inclined state between support portions Fa at either side of the support frame F. The guide rails 7 are supported on the support portions Fa in such a manner that an angle of inclination θ thereof with respect to the horizontal is freely adjustable. Each of the guide rails 7 is pivotably attached at, for example, one end thereof to one of the support portions Fa, and the angle of inclination θ can be adjusted by adjusting the vertical position of the other end thereof and fixing it to the other of the support portions Fa.

A holder 8 is supported on the guide rails 7, as a substrate support means that is free to slide along the guide rails 7. The holder 8 has a flat suction surface on a lower surface thereof, and the configuration is such that a flat-plate substrate S can be removably attached thereto. The inclination of the lower surface of the holder 8 is set to be at the same angle as the inclination of the guide rails 7. If the substrate S is rectangular, the suction surface on the lower surface of the holder 8 could also be of the same shape. In order to enable removal of the substrate S from the suction surface, a large number of suction holes can be provided in the suction surface, and a vacuum evacuation pipe connection portion 9 for exerting a suction force to the suction holes may be provided in an upper portion of the holder 8. A precision ball-screw drive apparatus or a low-vibration drive apparatus combining a linear motor and air suspension can be used as movement means for moving the holder 8 along the guide rails 7. In the embodiment shown in FIG. 2, a precision ball-screw SC is screwed into the holder 8 and it is driven in rotation by a motor M. Note that other movement methods can be used as the movement means.

A application head H is provided protruding upward from a base stand 11 of the support frame F. The application head H is configured, as also shown in FIG. 1, such that it has an elongated shape extending in a direction intersecting the direction of movement of the holder 8, a linear slit 13 opens upward as application liquid supply means on an upper surface thereof, and an application liquid (described later) that passes through the slit 13 is supplied upward and forms application liquid bead.

Figure 3A:
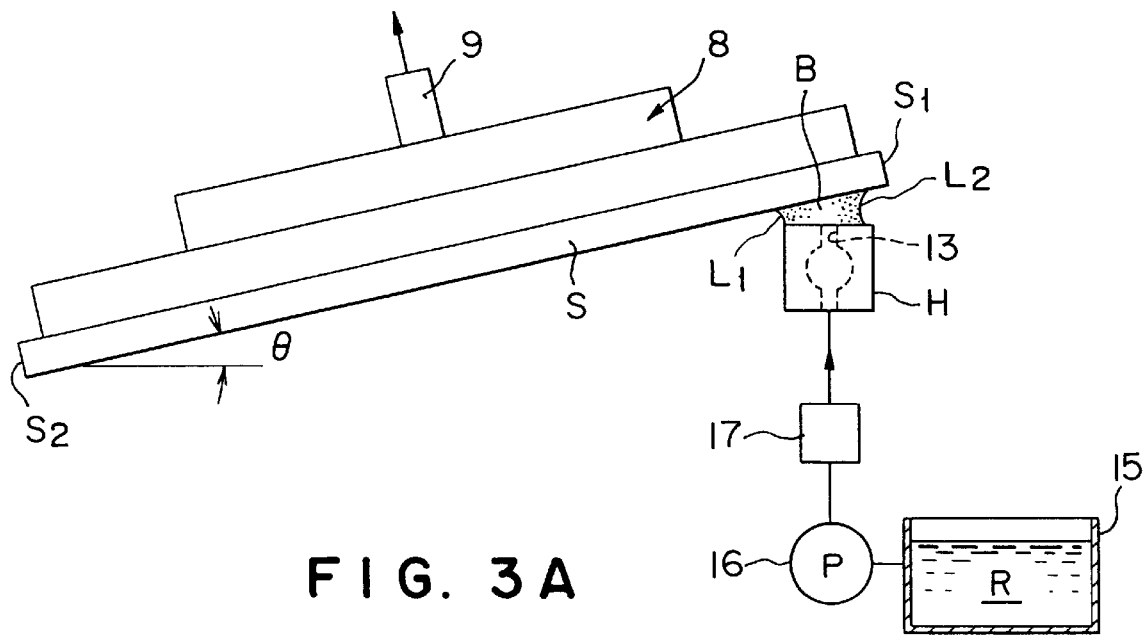
FIG. 3A is an illustrative view showing the principle of one portion of FIG. 2.

A state in which the application of liquid to the substrate S has started is shown in FIG. 2 and also in FIG. 3A which is an enlarged view showing a part thereof. As shown in FIG. 3A, the position of the holder 8 is determined such that the linear slit 13 of the application head H is positioned at a constant clearance (gap) directly below and close to the lower surface of a highest edge S1 of the substrate S, which is held secured at an angle θ with respect to the horizontal on the lower suction surface of the holder 8.

Figure 3B:
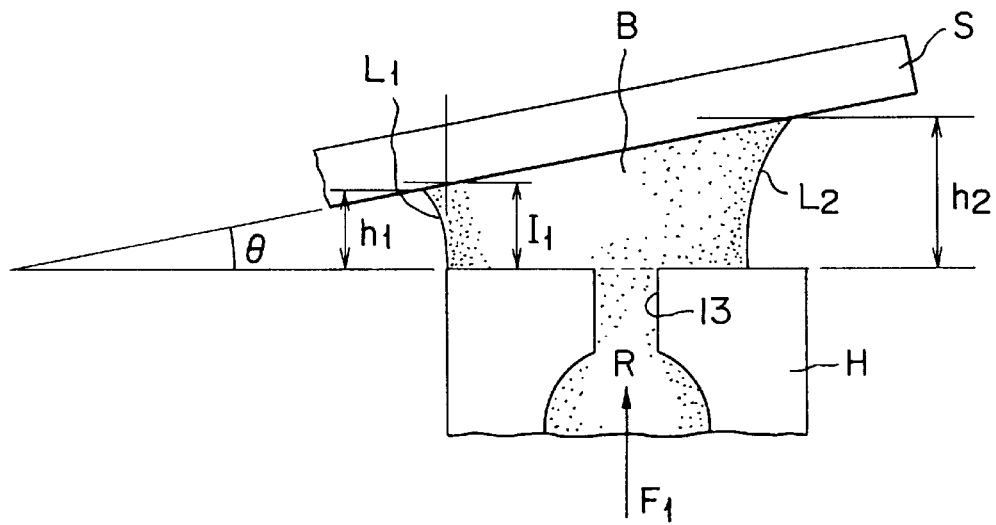
FIG. 3B is an enlarged illustrative view of a portion of FIG. 3A.

An application liquid R such as a photosensitive resin is stored in an application liquid tank 15, and it is transferred to the application head H through a suction-back valve 17, which will be described later, by a liquid-transfer means such as a pump 16. The liquid R is then sent out from the slit 13 and forms an application liquid bead B. If a means that makes use of the difference in heights of liquid surfaces (as will be described later with reference to FIG. 26) is used as the liquid-transfer means, pulsation of liquid such as those caused by the pump, etc., during liquid transfer can be prevented. The application liquid bead B is formed as a liquid accumulation of the application liquid R in the clearance (gap) between the lower surface (main surface) of the substrate S and the application head H, and this liquid bead B attaches to the lower surface of the substrate S. As shown in FIG. 3B, which is an enlargement of the bead B portion, a minimum clearance (gap) $I_1$ between the lower substrate surface and the application head must be set in such a manner that the application liquid bead B is formed by physical properties of the application liquid R such as viscosity and surface tension, without the application liquid R overflowing from the clearance (gap). When the application liquid bead B has been formed as shown in FIG. 3B, a meniscus $L_1$ is formed facing the lower side of the substrate and a meniscus $L_2$ is formed facing an upper side of the substrate, but height dimensions $h_1$ and $h_2$ of the menisci $L_1$ and $L_2$ are in the relationship $h_1 < h_2$, because of the angle of inclination θ.

The procedure of the application on the main surface that is the lower surface of the substrate S, from the application start state of FIG. 3A, will now be described.

Figure 5:
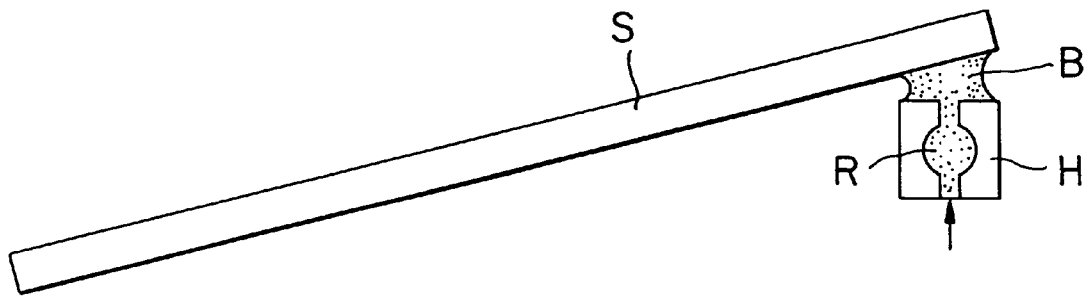
FIG. 5 is a view of a state at the start of liquid application.
Figure 6:
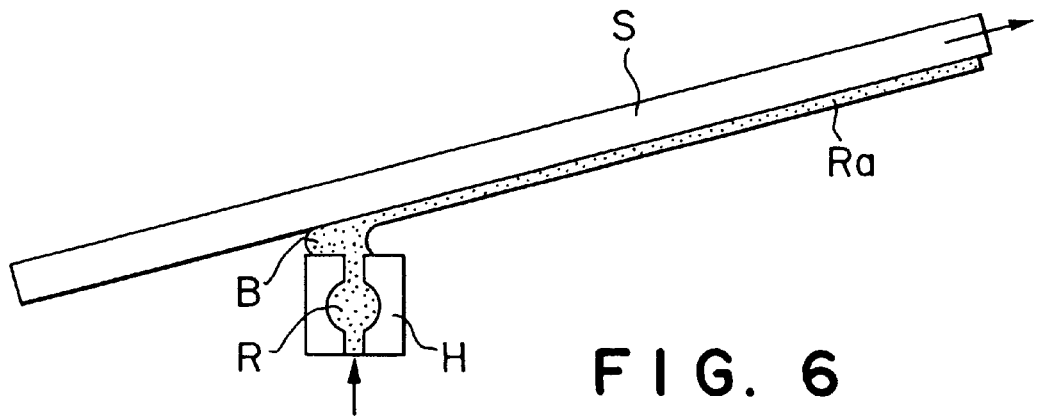
FIG. 6 is a view of a state during liquid application.
Figure 7:
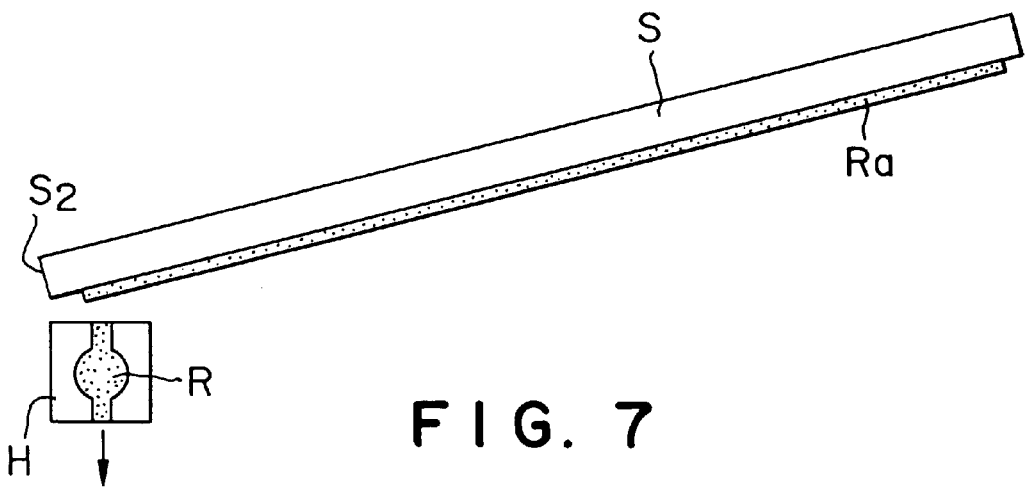
FIG. 7 is a view of a state at the end of liquid application.
Figure 8:
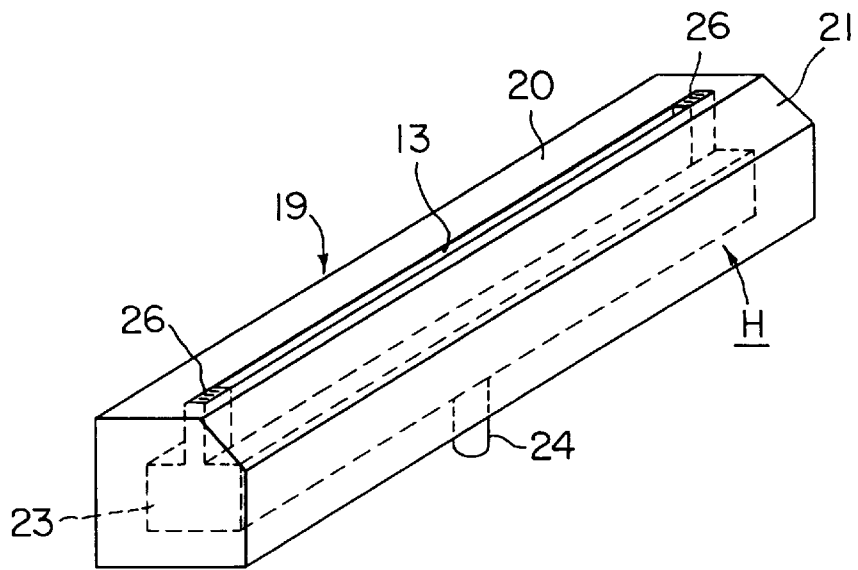
FIG. 8 is a perspective view of an example of an application head.
Figure 9:
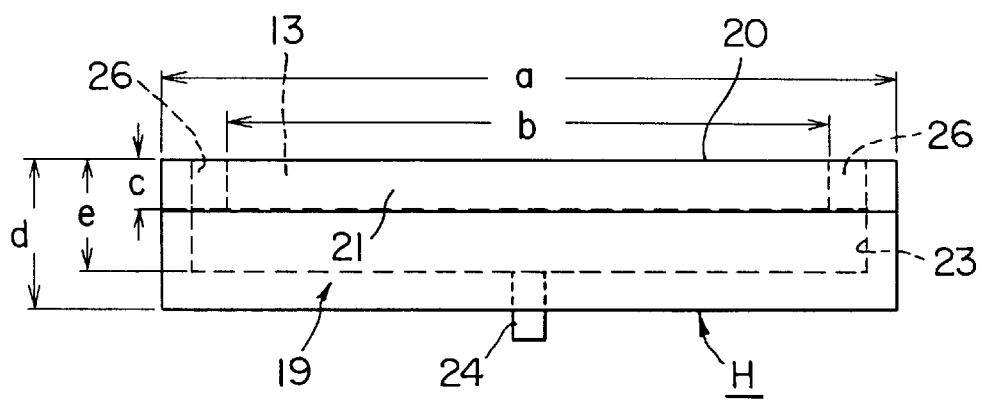
FIG. 9 is a side view of the same.
Figure 10:
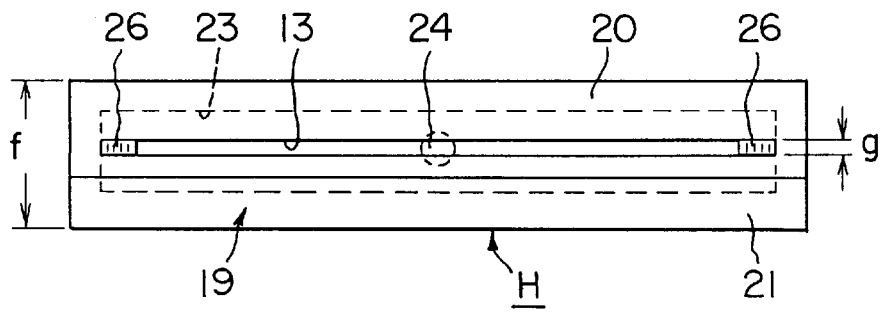
FIG. 10 is a plan view of the same.
Figure 11:
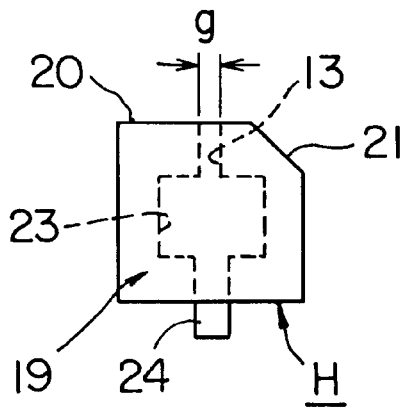
FIG. 11 is an end view of the same.

When the clearance (gap) is held constant and the holder 8 is moved upward from the position of FIG. 2 along the guide rails 7, the substrate S moves inclined upward, as shown in FIG. 6, with respect to the application head H at a constant angle of inclination θ from the state shown in FIG. 5, which is equivalent to that shown in FIG. 3A. In parallel thereto, if the application liquid R continues to be sent to the application head H by the pump 16 and thus the bead B continues to form, the application liquid R is sequentially attached to the main surface that is the lower surface of the substrate S, and thus an application layer Ra is formed. During this application process, the application liquid R must be supplied into the application liquid bead B by the liquid-transfer means in an amount sufficient for the sequential application, so that the form of the bead is held constant. At the point at which the application head H reaches an end of an application range close to a lowermost edge S2 of the substrate S, as shown in FIG. 7, the movement of the substrate S stops and then, after the application liquid R remaining within the clearance (gap) is sucked into the application head H by reverse suction by the operation of the suction-back valve 17, thus reducing the application liquid bead B, the application head H is removed as necessary to a location at which it will not obstruct the substrate S.

Subsequently, the substrate S is made horizontal and orientated in either an upward or downward direction within the drying unit 5 (see FIG. 1) where a uniform application layer is formed by causing the application layer Ra to dry, using drying means such as a hot plate, hot air, or an infrared heater.

Conveying the holder 8 while maintaining the vacuum adhesion from the rear surface of the flat-plate substrate on the flat suction surface of the holder 8 has the advantage that, even if the substrate S has a slight, temporary curve, it can be corrected into a completely flat state, and also, when the substrate is conveyed while in contact with the application liquid bead B and thus a layer of the application liquid is formed, the substrate maintains a constant angle of inclination and can always be held in a flat state. Thus, the formation of the application layer is stabilized.

Note that a thermoregulator is provided in the holder 8 so that the temperature distribution of the substrate S held on the holder 8 is kept uniform and thus the quality of the thus-formed layers can be maintained uniform.

In the case where the speed of application is comparatively moderate when applying liquid to the main substrate surface, drooping of the application liquid and variations in the layer thickness during the application can be suppressed, by applying the liquid while considering the distance from the application start point on the main surface of the substrate until the application liquid R no longer flows because of the volatility of the solvent after the start of application.

When liquid is to be applied at high speed, the application liquid will flow on the main surface of the substrate after the application and thus. differences in layer thickness exceeding permissible limits tend to occur. Therefore, the movement toward the final position of the application liquid bead can be completed before this problem occurs, and the main surface of the substrate can be held either downward-pointing or upward-pointing, to suppress drooping of the application liquid and variations in the layer thickness.

Figure 4:
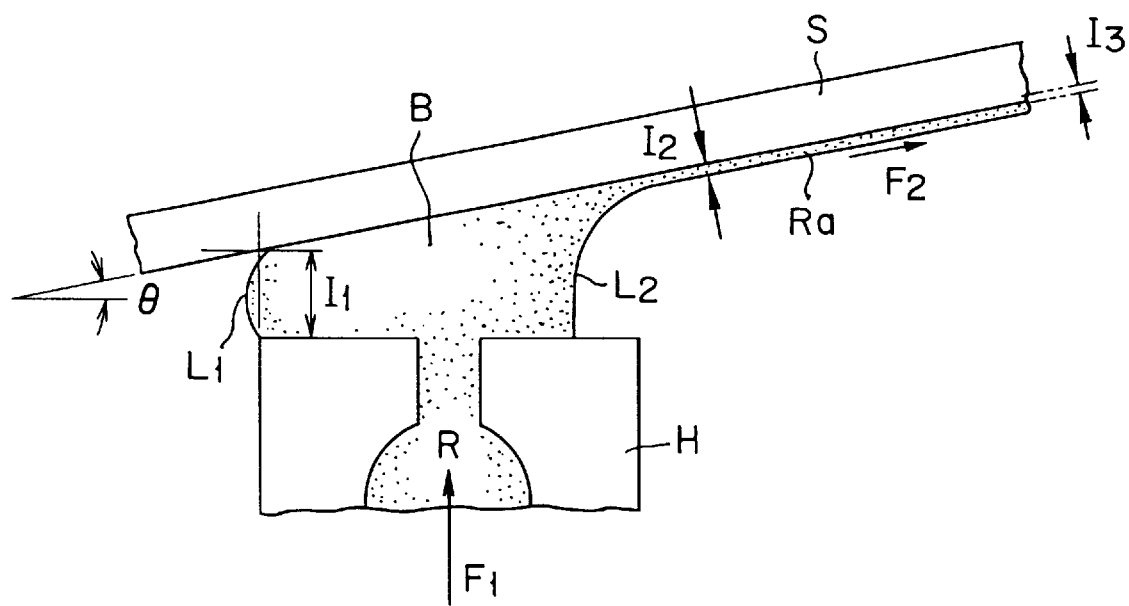
FIG. 4 is an illustrative view of a phenomenon that occurs during liquid application.

In a state partway through the above described application process shown in FIG. 6, the state of the application layer Ra and the application liquid bead B is as shown in FIG. 4. In other words, the meniscus $L_2$ of the bead B is maintained in a state such that a height dimension $h_2$ thereof is greater than height dimension $h_1$ of the meniscus $L_1$. A supply quantity $F_1$ per unit time of the application liquid R sent to the application head H is roughly equal to a liquid consumption quantity $F_2$ per unit time that is consumed in applying the application layer Ra. The bead B functions as a buffer portion interposed between the liquid supply side and the liquid consumption side.

The minimum clearance $I_1$ during the application process is held constant. However, the substrate S, particularly the main surface of a substrate for an LCD color filter has a low degree of flatness, and has unevenness of, for example, up to about 100 $\mu$m (usually 50 to 70 $\mu$m). With a method that determines the thickness of the applied layer by a clearance (gap) away from the substrate, such as knife-coating or roll-coating, the application layer thickness varies locally because of unevenness in the surface of the substrate, so a uniform applied layer cannot be obtained. With the method of the present invention, on the other hand, the effects of any unevenness in the substrate can be suppressed during the application by the formation of an application liquid bead B having a sufficiently large clearance $h_2$ of between 10 to 1,000 times, preferably at least 20 times, with respect to the layer thickness $I_2$ that is being formed (see FIG. 4). Moreover, since the substrate S is inclined at the angle $\theta$ during the formation of the liquid layer Ra, the applied liquid Ra flows down toward the lower end of the inclination after the application, smoothing the surface of the application layer. To obtain this smoothing effect on the application liquid, a preferable angle $\theta$ is between 5 degrees and 10 degrees, and is particularly preferably 11 degrees. Note that the angle $\theta$ can be, in principle, within the range of 0 degrees to 90 degrees. Depending on the substance of the application liquid and the state of the main surface of the substrate, it is possible that a preferable angle could be outside the range of 5 to 20 degrees. The viscosity of the application liquid depends also on factors such as the thickness of the applied layer, the speed of movement of the substrate, and the wetting characteristics between the substrate and application liquid, but it is in general about 10 cps. The thickness of the applied layer is generally within the range of 0.1 to 5 $\mu$m in a dried state.

Figure 12:
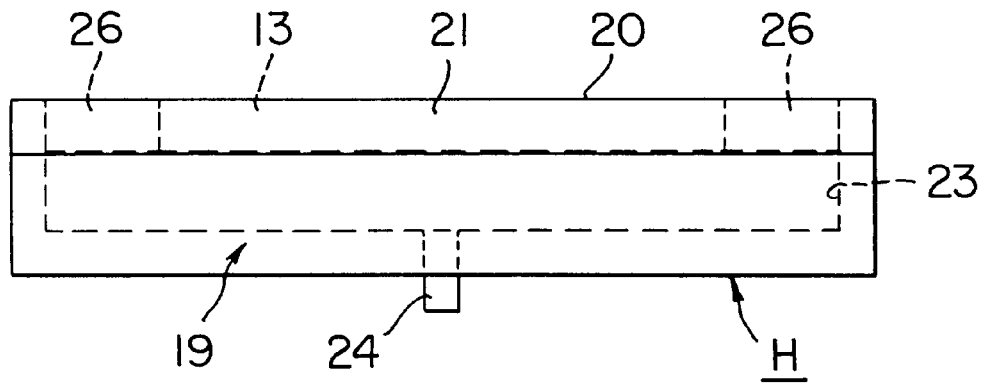
FIG. 12 is a side view similar to that of FIG. 9, but showing an example in which the length of a slit for supplying the application liquid has been narrowed.
Figure 13:
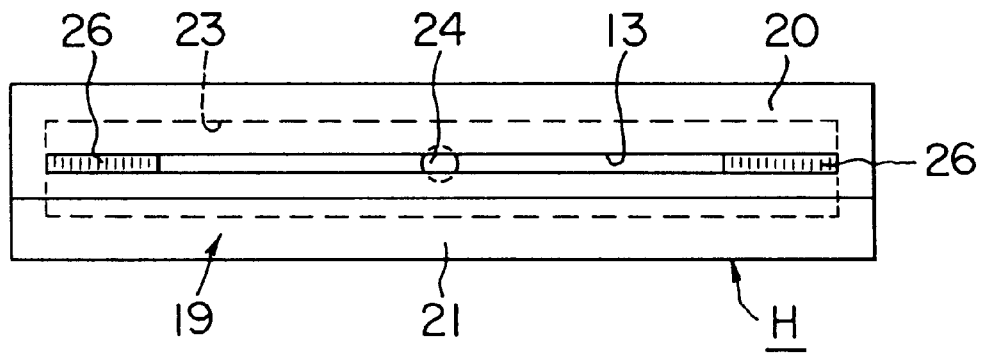
FIG. 13 is a plan view of FIG. 12.

An example of an application head H that could be used by the present invention is shown in FIG. 8 to FIG. 11. In these figures, the application head H has a main body 19 that is generally elongated, and an upper surface of this main body is configured of a horizontal surface 20 and an inclined surface 21. Within the main body 19 is formed a long, thin hollow space 23 in the longitudinal direction thereof, and an application liquid supply pipe 24 is connected to a lower central portion of the hollow space 23. An upper portion of the hollow space 23 communicates with the above described linear slit 13 that is of the same length thereof but is narrower. Pieces of application width adjustment packing 26 are packed within the slit 13, and the application width of the slit 13 can be adjusted by varying the width of this packing 26, as shown in FIG. 12 and FIG. 13. An example of the various dimensions of the application head H are given below.

| | |
|---|---|
| Length _a_ of main body 19: | 400 mm |
| Length _b_ of slit 13: | 350 mm |
| Distance _c_ from horizontal surface 20 of main body to upper edge of hollow space 23: | 27 mm |
| Height _d_ of main body 19: | 80 mm |
| Distance _e_ from horizontal surface 20 of main body to lower edge of hollow space 23: | 67 mm |
| Width _f_ of main body 19: | 50 mm |
| Width _g_ of slit 13: | 2 mm |

An example of typical application conditions is given below.

| | |
|---|---|
| Application speed (v): | 30 mm/s |
| Liquid viscosity ($\eta$): | 8.5 cps (at 23° C.) |
| Solids content (s): | 2.5 wt % |
| Layer thickness (t): | 6000 Angstrom (dry) |
| (Static) surface tension ($\gamma$): | 51.0 dn/cm |
| Application liquid: | Aqueous solution of PVA/diazo |
| Clearance (gap) ($I_1$): | 300 $\mu$m |
| Angle of inclination ($\theta$): | 11 degrees |

Examples of modifications of the application head that could be used by the present invention are shown in FIG. 14 to FIG. 19. In the modification shown in FIG. 14 and FIG. 15, an application head $H_1$ has inclined surfaces 29 inclined on both sides of a top surface of a main body thereof, in a roof shape, and the slit 13 is formed at the top edges of the inclined surfaces 29. Note that reference numeral 30 denotes a liquid supply portion. The modification shown in FIG. 16 and FIG. 17 is the same as the example shown in FIG. 8 in that the horizontal surface 20 and inclined surface 21 are formed at a top portion of a main body of an application head H$_2$, but it differs from the example of FIG. 8 in that the slit 13 is provided at a boundary portion between the horizontal surface 20 and the inclined surface 21. In other points, the example of FIG. 16 and FIG. 17 is the same as that of FIG. 14 and FIG. 15. In a modified application head H$_3$ shown in FIG. 18 and FIG. 19, an outlet portion 13a of the slit 13 expands outward from the configuration shown in FIG. 16 and FIG. 17. This makes the width of the application liquid bead B wider than those shown in FIG. 14 and FIG. 16, making it difficult for shear forces to occur in the bead B, which is thought to stabilize the application operation. Note that the width of the bead would be generally 1 to 10 mm.

An example of an application liquid supply apparatus for the application head H is shown in FIG. 20. In this figure, application liquid within a pressurized tank 36 is pressurized by pressure that operates within the pressurized tank 36 via a manual three-way valve 35. The pressurized application liquid is sent to the application head H via a coarse adjustment needle valve 37, a filter 38, a flowmeter 39, a fine adjustment needle valve 40, a pneumatically operated valve 41, and the suck-back valve 17. The suction-back valve 17 generates a negative pressure in the interior thereof when necessary by rapidly moving a piston 17a within a cylinder 17b, and has the effect of operating to rapidly suck the application liquid from the outside via the slit 13 in the application head H.

Another modified example of application head H$_4$ is shown in FIG. 21 and FIG. 22. Each of the application heads H, H$_1$, H$_2$, and H$_3$ that have been described up until now has a linear slit 13 provided in an upper portion thereof, with the configuration being such that application liquid is supplied upward through this slit, but the application head H$_4$ is not provided with a slit. The application head H$_4$ is formed of a box-shaped vessel of which the upper side is open, and the application liquid R is accommodated therein in such a manner that it bulges upward as shown in FIG. 21. If a substrate S is brought into contact in an inclined state with the application head H$_4$ in such a manner that a lower surface thereof touches the application liquid R, the application liquid bead B is obtained when menisci are formed, as shown in FIG. 22. In this state, application liquid is supplied into the application head H$_4$ via a liquid supply portion 50, a liquid layer is formed in a similar manner to that of the above described embodiment by moving the substrate S diagonally upward relative to the application head H$_4$.

Figure 24:
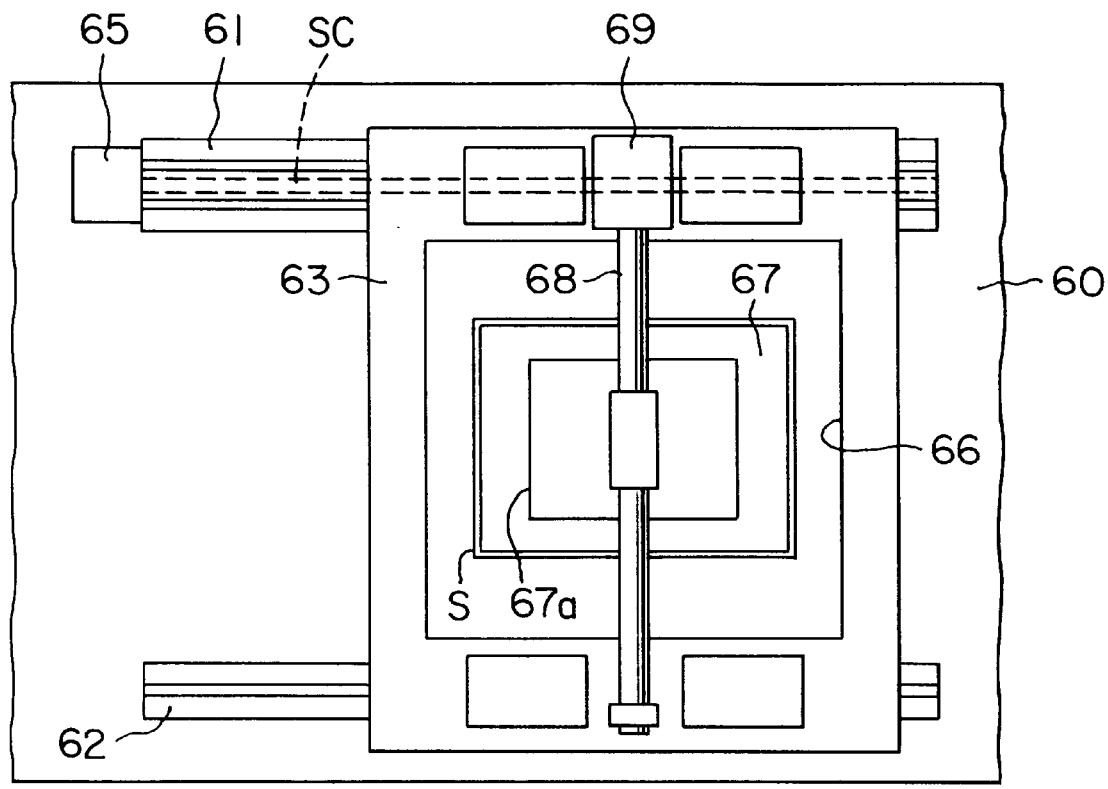
FIG. 24 is a plan view of the liquid application apparatus of FIG. 23.
Figure 25:
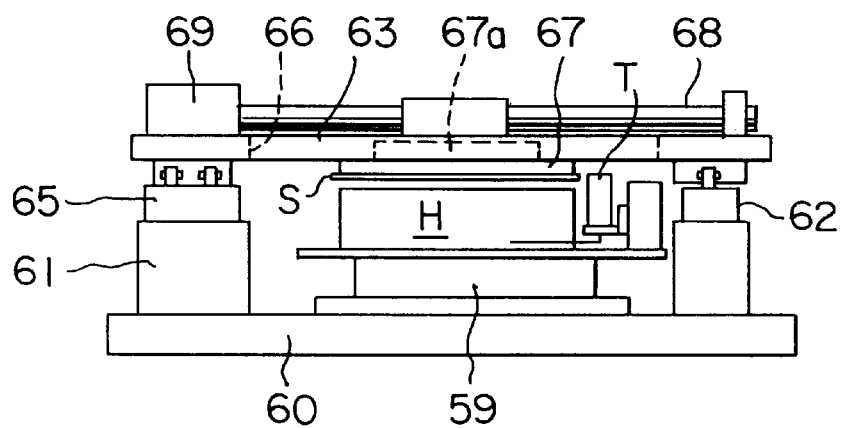
FIG. 25 is a side view from the left of FIG. 24.

Another embodiment of the liquid application apparatus of the present invention is shown in FIG. 23 to FIG. 25. As shown in FIG. 25, this liquid application apparatus has a stage 60, and this stage 60 is supported by a support frame similar to the support frame F of FIG. 2 in such a manner that its inclination can be re-adjusted by an inclining mechanism that is not shown in the figure. A pair of horizontal linear guides 61 and 62 is fixed to an upper surface of the stage 60 with a space therebetween. A flat-plate-shaped movable plate 63 is mounted on the linear guides 61 and 62 in such a manner as to be guided along the linear guides. As shown in FIG. 24, a precision ball screw SC is passed through the interior of one linear guide 61, and this ball screw engages with movable plate 63. The ball screw SC is configured in such a manner as to be driven in rotation by an actuator 65. Thus the movable plate 63 can be moved in the lateral direction as seen in FIG. 24 by the operation of the actuator 65.

A rectangular opening 66 is provided in a central portion of the movable plate 63 and a rectangular holder 67 is positioned as a substrate support means within the opening 66. The holder 67 has a configuration similar to that of the holder 8 of FIG. 2, with one surface acting as a substrate suction surface. In FIG. 25, the substrate suction surface is directed downward and is holding a substrate S by suction. A protruded portion 67a provided on the rear surface of the holder 67 on the opposite side to the substrate suction surface thereof is fixed to a rotational shaft 68, the two ends of the rotational shaft 68 are supported in a freely rotatable manner on the movable plate 63, and one end of the rotational shaft 68 is linked to an actuator 69 for reversing the holder. If the rotational shaft is rotated by the action of the actuator 69, the holder 67 can be rotated between a position at which the substrate suction surface thereof is oriented downward, as shown in FIG. 24 and FIG. 25, and a position at which the substrate suction surface is oriented upward.

The application head H is supported on the stage 60 with an inclination and height adjustment mechanism 59 therebetween, as shown in FIG. 25, and an application liquid supply means similar to the linear slit is provided in the application head. An application liquid tank T for supplying application liquid is also provided in the application head H. The application liquid tank T will be described below, but an application liquid supply apparatus such as that previously described with reference to FIG. 3A could be provided instead of the application liquid tank.

With this embodiment, the substrate S can be easily sucked by and removed from the substrate suction surface of the holder 67. In order to maintain the suction of the substrate S to the holder 67, the holder 67 has rotated upward via the rotational shaft 68 by the operation of the actuator 69, the suction surface is orientated upward as shown by the broken lines in FIG. 23, and the substrate S is placed thereon and sucked thereby, then the holder 67 is rotated through 180 degrees by the action of the actuator 69 in such a manner that the suction surface faces downward. The stage 60 could have been previously inclined at an angle θ, or it could be inclined at this point. If the actuator 65 is operated, the movable plate 63 and the holder 67 supported thereon can be moved along the linear guides 61 and 62, held at the angle of inclination θ. The application head H can now be positioned by the inclination and height adjustment mechanism 59 with respect to the substrate S on the lower surface of the holder 67, in the same manner as shown in FIG. 3A. Thus, the liquid can be applied to the lower surface of the substrate S in the same manner as shown in FIGS. 5 to 7. After completion of the liquid application, the holder 67 is rotated to face upward by means of the actuator 69 and then the upwardly facing substrate S with the liquid applied thereon is removed from the holder 67.

Figure 26:
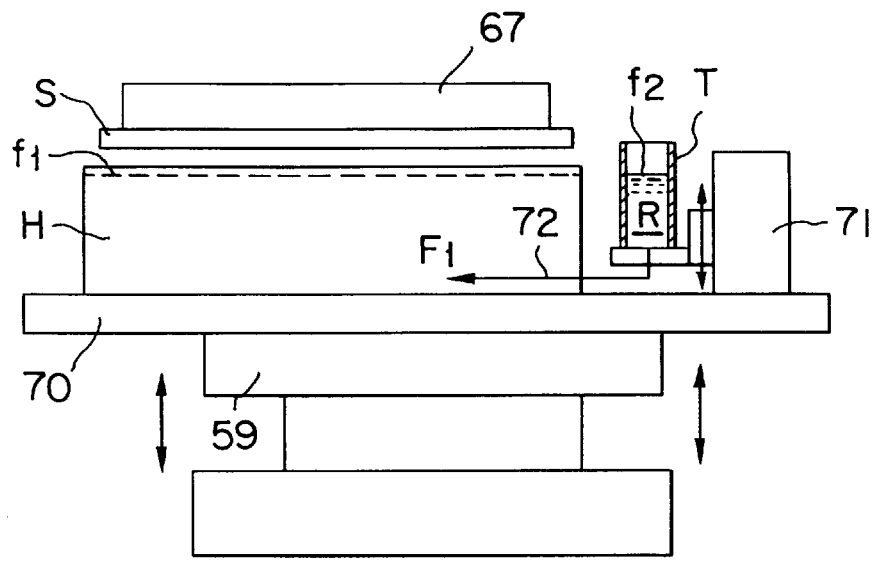
FIG. 26 is a view of a modification of the application liquid supply apparatus.

The principle of the application liquid supply apparatus provided by the application liquid tank T shown in FIG. 25 will now be described with reference to FIG. 26. As shown in this figure, the application head H as well as a vertical movement mechanism 71 is supported on a stage 70 that is supported by the inclination and height adjustment mechanism 59. The previously mentioned application liquid tank T is provided on a support bracket in such a manner that it can be freely moved in the vertical direction by the vertical movement mechanism 71, and application liquid R is accommodated in the tank T. Note that substrate S sucked by the lower surface of the holder 67 faces the upper side of the application head H. An application liquid supply pipe 72 passes from the tank T into the application head H.

The above described application liquid supply apparatus makes use of the difference in height of the liquid surface within the application liquid tank T to supply application liquid. At the start of application, the application head H is raised by the height adjustment mechanism 59 to a predetermined position and is set thereat, in order to set a predetermined clearance (gap). At this point, a height f1 of the liquid surface of the application liquid R within the application head H is the same as and matches a height f2 of the liquid surface of the application liquid R within the application liquid tank T. Next, the vertical movement mechanism 71 is driven in order to form the application liquid bead B within the set clearance (gap), and the tank T is raised. This breaks the balance of the liquid surface heights so that the application liquid R is supplied from the tank T to the application head H. The amount supplied in this case is determined by the amount through which the tank is moved, corresponding to the size of the thus-formed application liquid bead B. Application then starts in the same manner as shown in FIG. 6, and the tank T is raised further to supply an amount of the application liquid R necessary for forming the application layer Ra. At this point, the supply quantity $F_1$ per unit time sent into the application head H is determined by the rate at which the tank T is raised. At the end of application shown in FIG. 7, the liquid surface height f1 of the application liquid R within the application head H and the liquid surface height f2 of the application liquid R within the tank T are once again equal and in balance. The application liquid bead B can then be removed by lowering the tank T by a constant amount.

Figure 27:
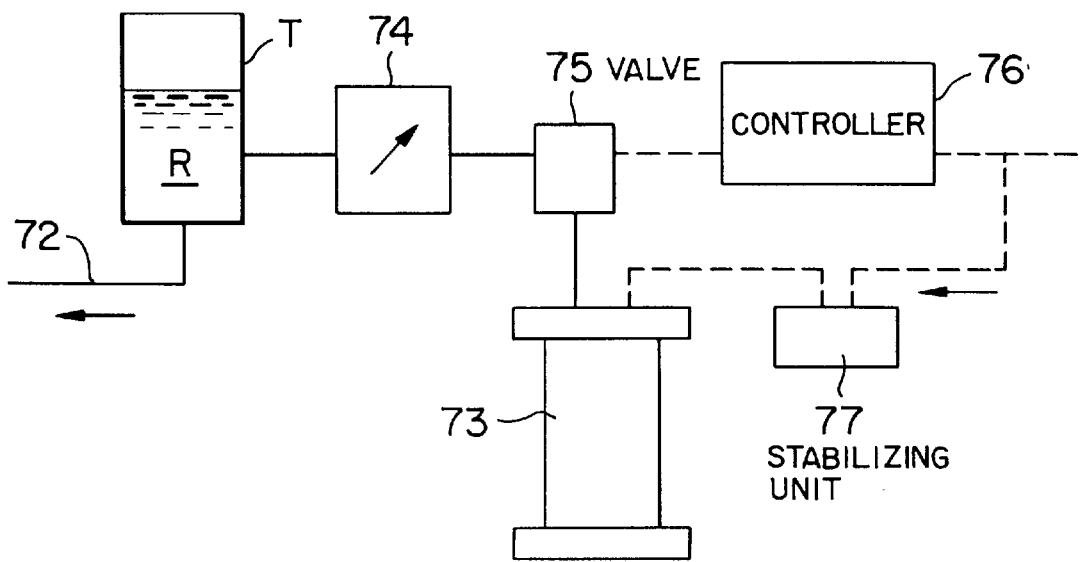
FIG. 27 is an explanatory view of the application liquid supply apparatus of FIG. 27.

The liquid surface height of the application liquid R added within the tank T is determined by an amount of the application liquid R (this amount is equal to the liquid amount $F_2$ consumed during the application) from a pressurized tank 73 that is measured by a flowmeter 74 and sent into the tank during non-application, as shown in FIG. 27, and is controlled in such a manner that the height is always constant at application start. Note that an openable value 75 is provided between the pressurized tank 73 and flowmeter 74 shown in FIG. 27, and the opening and closing of this openable value 75 is controlled by a controller 76. The controller 76 controls the pressure within the pressurized tank 73 by adjusting the amount of air sent into the interior thereof via a stabilized unit 77. This supply method is preferable because it can prevent pulsations during the liquid supply, in comparison with the previously described method of supply using a pump.

Figure 28:
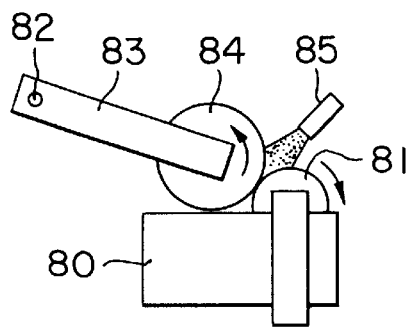
FIG. 28 is a view of an apparatus for removing excess application liquid.
Figure 29:
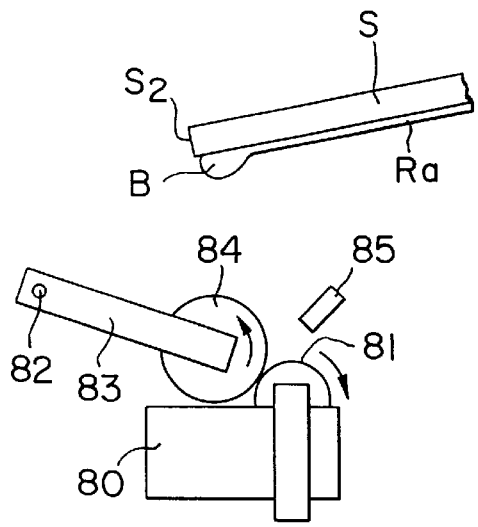
FIG. 29 and FIG. 30 are views of different operational states of the apparatus of FIG. 28.
Figure 30:
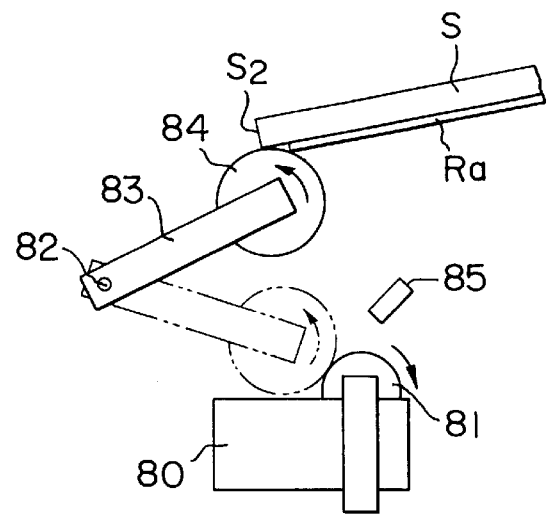

At the end of the application process, surplus application liquid and the application liquid bead are removed, and the method shown in FIG. 28 to FIG. 30 could be used instead of the above described suck-back method in order to prevent liquid drooping and the smearing of liquid around the edge portions and rear surface of the substrate. With this method, an ink-pan 80 and a doctor roll 81 that rotates therein are provided below the lower edge portion of the substrate at the end of application, as shown in FIG. 28. An arm 83 that is rotatable vertically about a pivot 82 is also provided, and the configuration is such that, when the arm 83 is in a lowered position shown in the figure, a wiping rotational roll 84 at a tip of the arm 83 is in contact with the doctor roll 81. A washing spray nozzle 85 is arranged above the doctor roll 81 and facing the doctor roll 81.

In a standby state shown in FIG. 28, the wiping rotational roll 84 is lowered and washed by a washing liquid from the washing spray nozzle 85, and the washing liquid is scraped off by the doctor roll 81. When the raising of the substrate S to the application completion position has ended, a lowermost edge portion S2 of the substrate S reaches a position above the wiping rotational roll 84, as shown in FIG. 29. At this point, the arm 83 is rotated upward from the standby position and rises to an operating position shown in FIG. 30. This brings the washed wiping rotational roll 84 into contact with the lowermost edge S2 of the substrate S, while rotating it, and wipes off and removes the surplus application liquid. The arm 83 is then lowered and the wiping rotational roll 84 is subjected to the washing operation shown in FIG. 28, ready for the next wipe.

Figure 31:
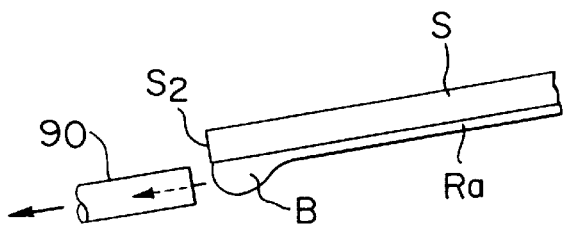
FIG. 31 is an explanatory view of an example of an excess application liquid removal apparatus.

Another method of removing surplus application liquid is shown in FIG. 31. With this method, a vacuum suction pipe 90 provided separately from the application head is configured to be placed close to the lowermost edge S2 of the substrate at the end of the process of application on the substrate S, and the surplus liquid including the application liquid bead B is sucked off thereby. This can provide a method of efficiently removing the application liquid by suction while a small amount of water is supplied, particularly when the application liquid is water-based.

In the embodiments of the present invention described up until now, the configuration is such that the application head is fixed and a holder that acts as support means for supporting the substrate is inclined and moved relative to the application head. However, since the application head and the substrate could be maintained at a predetermined inclined relationship and moved relative to one another, the application head could be moved and the substrate held fixed instead.

Such an embodiment will be described below with reference to FIG. 32 to FIG. 37. With this embodiment, the substrate S is first secured on top of a flat suction surface of a substrate holder 8A, as shown in FIG. 32. The holder 8A is configured to be free to rotate about a pivot 93, and the substrate S is held horizontally on the suction surface of the holder 8A by means such as vacuum suction when the holder 8A is oriented upward as shown by the solid lines in FIG. 32. An inclinable stage 94 is provided below the holder 8A, and a support runner 96 of the application head H is supported and held along a guide rail 95 on an upper part thereof. In a state shown in FIG. 32 in which a substrate is being transferred, the application head H is in a standby position at the right edge of the figure.

The holder 8A then rotates 180 degrees about the pivot 93, as shown in FIG. 33, so that the substrate S is oriented with the main application surface thereof downward. The application head H moves slightly to the left in FIG. 33, until the slit 13 thereof reaches an application start position.

The entire apparatus is then rotated until both the stage 94 and the holder 8A reach an angle of inclination θ, as shown in FIG. 34. The stage 94 and the holder 8A could be inclined separately, but it is better to rotate a unit that supports both of them together about the center of a rotational shaft 97.

With the inclined state of FIG. 34 held, the application head H is moved along the guide rail 95 as shown by the arrow in FIG. 35. During this time, the application liquid is sent to the application head and the application liquid bead is formed in the same manner as in the previously described embodiments. This applies an application layer to the main surface that is the under surface of the substrate S. After the application has ended, surplus application liquid is removed by one of the methods described above.

After the application process has been completed, the entire unit is returned to the horizontal state about the center of the rotational shaft 97, as shown in FIG. 36. The holder 8A is then rotated through 180 degrees about the pivot 93, as shown in FIG. 37, so that the completed substrate S reaches an upward position and it can be removed from the holder 8A.

Figure 38:
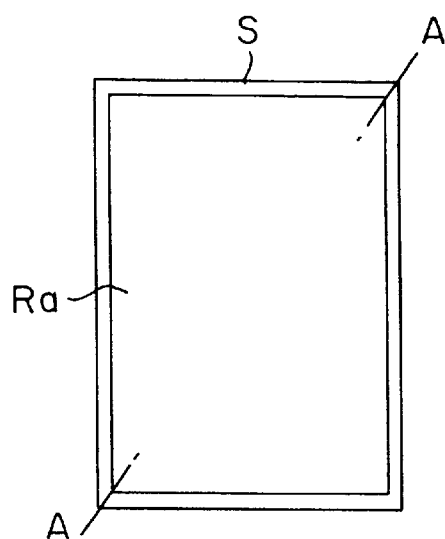
FIG. 38 is a plan view of a liquid-applied substrate obtained in accordance with the present invention.
Figure 39:
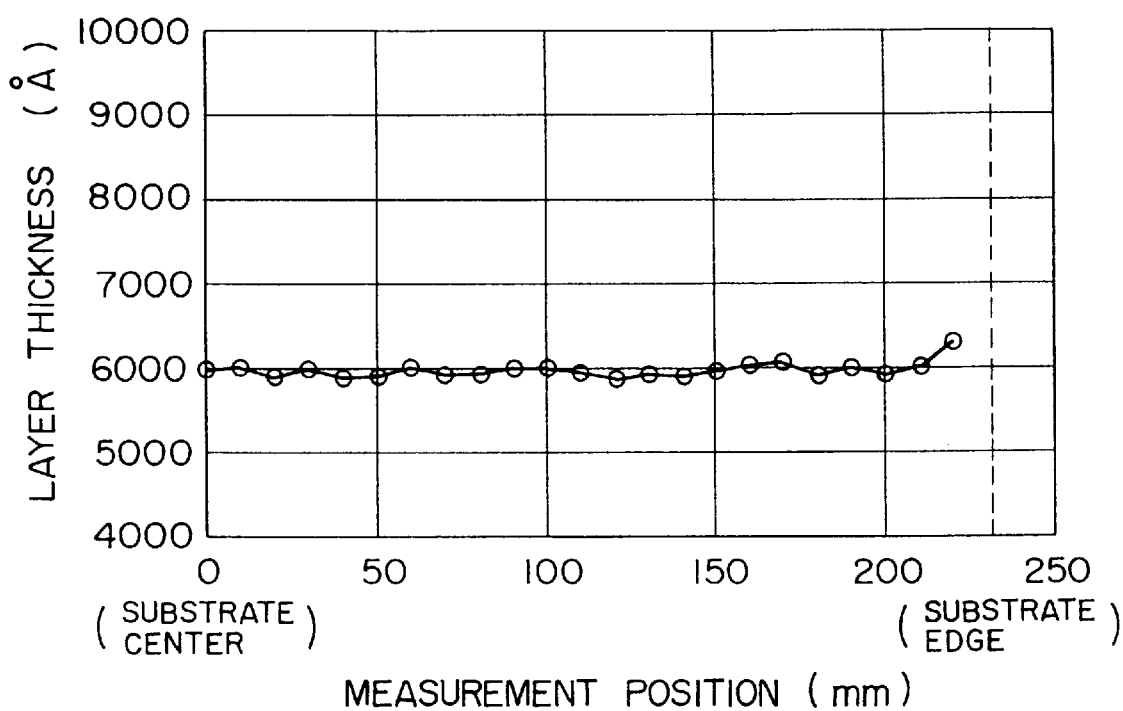
FIG. 39 is a graph of layer thickness distribution taken along the line A—A of the substrate shown in FIG. 38.

In accordance with the present invention as described above, a substantially uniform thickness distribution of the applied layer, including corner portions, is obtained as shown in FIG. 39, taken along the line A—A of FIG. 38 showing the substrate S on which the application layer Ra is applied. In contrast, an application layer Ra obtained by spin coating has the defect that the corner portions thereof are particularly thick, as shown in FIG. 40 and FIG. 41.

In accordance with the present invention, the application uses a linear application liquid bead formed between a substrate and an application head to maintain a sufficient clearance (gap) of at least 20 times the application layer thickness between the substrate and the application head, whereby a uniform applied layer can be formed by a principle similar to that of dip coating, without being affected by any unevenness in the surface of the substrate. In other words, with the present invention, the application liquid layer drawn from the application liquid bead by the relative speed of the substrate and the application head is formed into a state in which it is held in dynamic equilibrium by the viscous resistance on the substrate surface, surface tension, and the force of gravity, making it easy to form a uniform layer thickness by a principle similar to that of dip coating. Application can also be done at low speeds by making use of a low-viscosity application liquid, and moreover a sufficiently large clearance (the clearance (gap) on the applied layer side from the application liquid bead) can be maintained with respect to the thickness of the thus-formed layer of application liquid. Therefore, if there should be large amounts of unevenness on the surface of the substrate, or if the force with which the application liquid layer is drawn from the application liquid bead should change in the direction of the application liquid bead, or if shear forces are likely to operate in the bead, this sufficiently large clearance (gap) can suppress the effects of shear forces and enable the formation of a uniform liquid layer.

Figure 46:
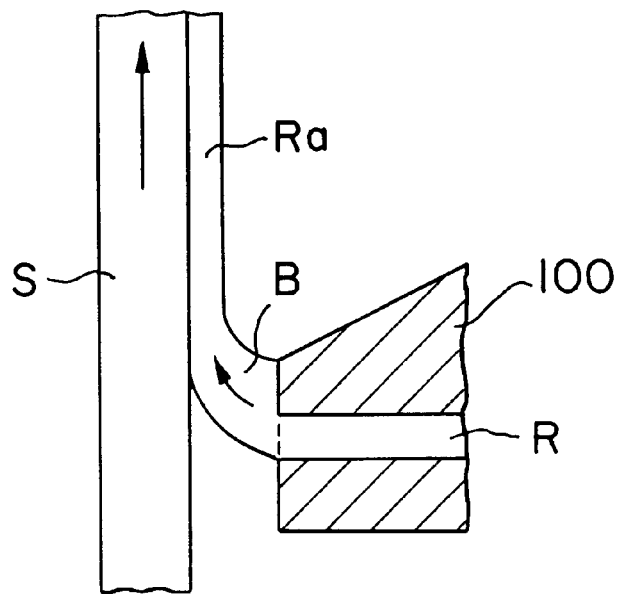
FIG. 46 and FIG. 47 are explanatory views of two known liquid application methods using application liquid bead.
Figure 47:
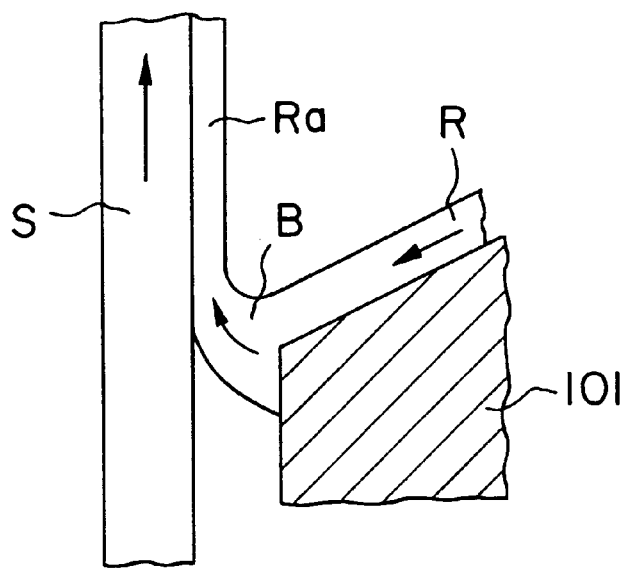

In comparison with the present invention as described above, since with previously known methods of supplying an application liquid in a substantially horizontal direction by using a die head or sliding die as stated at the start of this document, there is a perpendicular clearance (gap) between a die head 100 or a sliding die 101 and a substrate S, as shown in FIG. 46 and FIG. 47, it is easy for the bead B to be unable to resist the force of gravity and droop, especially if the substrate is in a static state, and thus it is inevitable that the clearance must be made small or the viscosity of the liquid must be increased. Since such a small clearance is provided, the effects of any shear forces generated by unevenness in the substrate cannot be suppressed, it is difficult to make the formed layer thickness uniform, and it is also difficult to form a thin layer because the viscosity of the liquid is high.

The present invention enables selective coating of one side only of the main surfaces of a substrate, which is not possible with the dip coating method that is unable to prevent coating of the rear surface of the substrate.

The present invention also avoids the problem with methods such as spin coating in which the application efficiency of resist is low, so that the application of an application liquid to a substrate is virtually 100% and loss of the application liquid during the application is extremely small. The throughput is also improved over that of the spin coating method. The thickness of the applied layer is controlled by the viscosity of the application liquid and the speed of movement of the substrate, so that the target applied layer thickness can be formed by such adjustment. Application can also be done selectively at any desired position of the substrate by varying the length of the application liquid supply means of the application head, in accordance with the size of the substrate.

EXAMPLE 1

A glass substrate for an LCD color filter, of width 300 mm, length 350 mm, and thickness 1.1 mm, was used as a substrate, and the substrate was vacuum secured against the holder 8. An aqueous solution of PVA with a solids content of 1.0% and a viscosity of 5.0 cps was used in the application liquid R. The application head H during this time was as shown in FIGS. 8 to 11, and was positioned such that the angle $\theta$ between the application head H and the substrate S was approximately 8 degrees. The application liquid pump was then used to supply the application liquid to the application head H and thus the application liquid bead B shown in FIG. 5 was formed. In this case, the heights $h_1$ and $h_2$ of the menisci $L_1$ and $L_2$ were 0.3 mm and 0.98 mm, respectively. The substrate was then moved at a speed of 20 mm/s to apply the application liquid to the main substrate surface as shown in FIG. 7. During this time, the application liquid was supplied in such a manner that there was no change in the shape of the application liquid bead B.

Figure 42A:
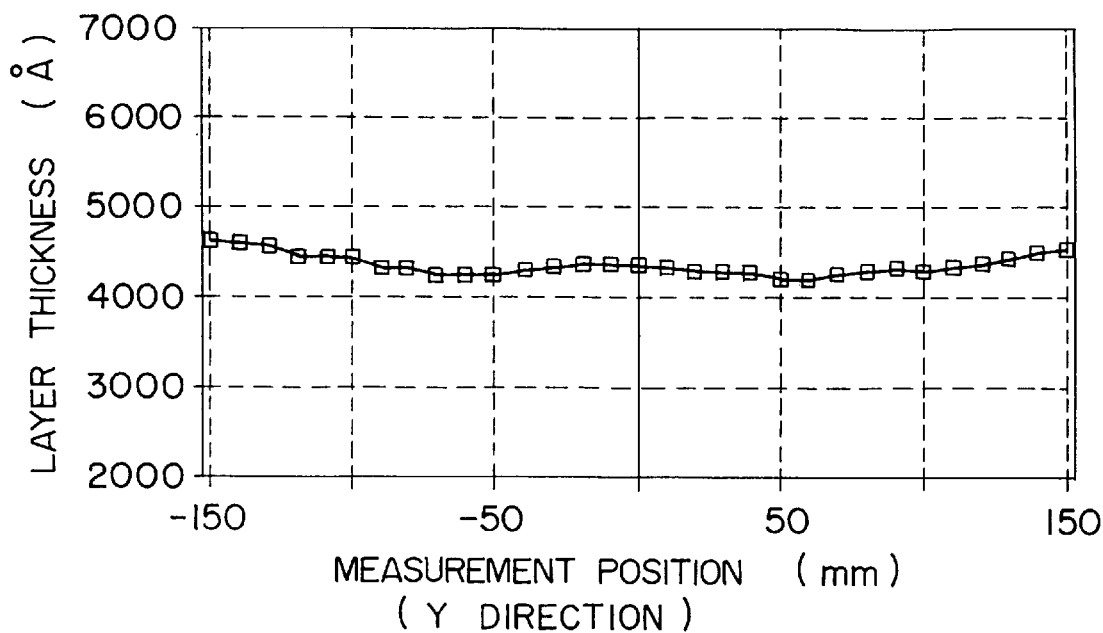
FIG. 42A and FIG. 42B are graphs of layer thickness distribution taken in two different directions of the applied layer on a substrate obtained by Example 1 of the present invention.
Figure 42B:
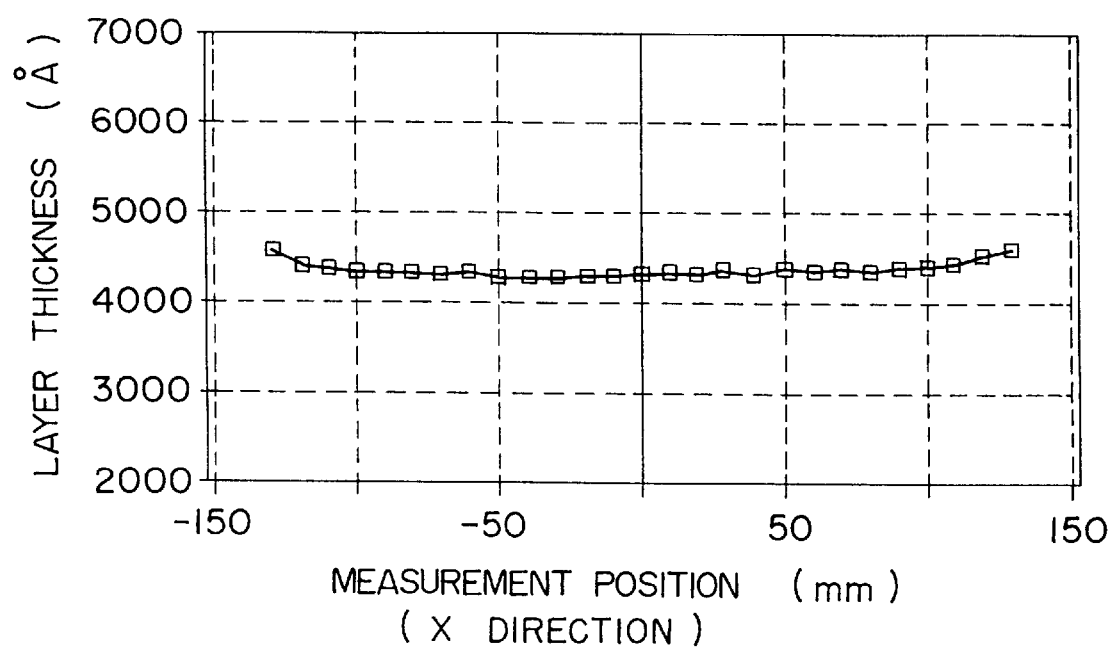

After the movement of the substrate has stopped at the point at which the application head H reached the lowermost edge of the substrate, the application liquid that formed the application liquid bead is sucked back into the application head H by the suction-back method and the application head H is moved back, then the substrate is removed from the holder and is dried in a recirculating oven at 80° C. for one minute. As a result, a good layer distribution of 4361 Angstrom+/−200 Angstrom was obtained within a 260 mm×300 mm surface of the substrate, as shown in FIG. 42A and FIG. 42B (where FIG. 42A is a graph of layer thickness distribution taken parallel to the direction of movement, in other words the Y-axis and FIG. 42B is a graph of layer thickness distribution taken perpendicular to the direction of movement, in other words the X-axis). The ratio of the height $h_2$ of the meniscus $L_2$ with respect to the wet-layer thickness $I_2$ of the application layer Ra was: $I_2:h_2=1:22.5$.

EXAMPLE 2

As shown in FIG. 12 and FIG. 13, the application width adjustment packing 26 is adjusted so that the application width is changed to 250 mm, and application is performed in the same sequence and with the same conditions as those of Example 1. As a result, a good layer distribution of 4359 Angstrom+/−199 Angstrom was obtained within a 200 mm×300 mm surface of the substrate, as shown in FIG. 43A and FIG. 43B (where FIG. 43A relates to the Y-axis and FIG. 43B relates to the X-axis).

EXAMPLE 3

Figure 44A:
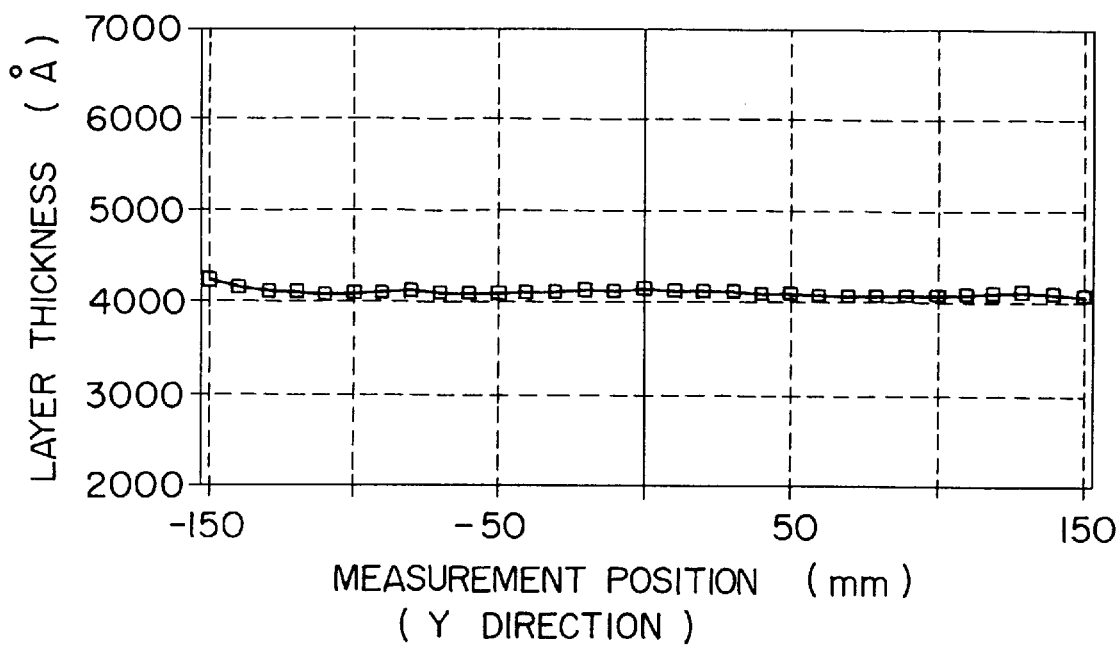
FIG. 44A and FIG. 44B are graphs of layer thickness distribution taken in two different directions of the applied layer on a painted substrate obtained by Example 3 of the present invention.
Figure 44B:
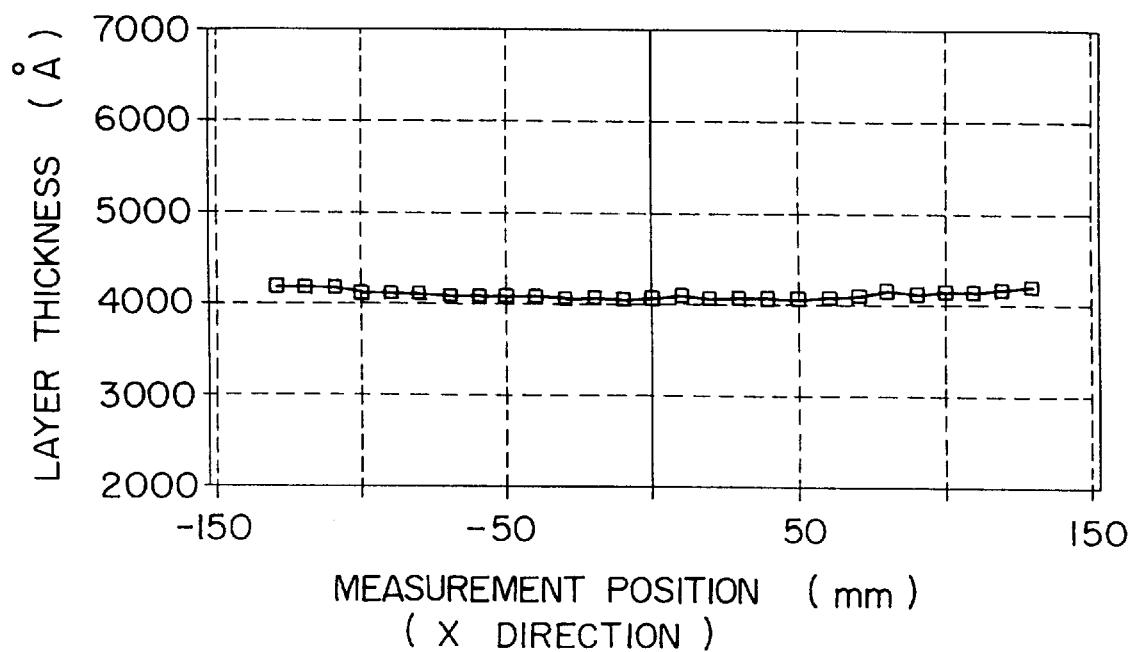

A photoresist OFPR-800 produced by Tokyo Ohka Kogyo having a viscosity of 2.5 cps and a solids content of 6.5% was used as the application liquid R of Example 1, and application was performed in the same manner as that of Example 1 wherein the angle $\theta$ was 8 degrees and the heights $h_1$ and $h_2$ of the menisci $L_1$ and $L_2$ were 0.3 mm and 0.98 mm, respectively, with the result being that a good layer distribution of 4088 Angstrom+/−90 Angstrom was obtained, as shown in FIG. 44A and FIG. 44B (where FIG. 44A relates to the Y-axis and FIG. 44B relates to the X-axis). The ratio of the height $h_2$ of the meniscus $L_2$ with respect to the wet-layer thickness $I_2$ of the application layer Ra in this case was: $I2:h_2=1:155.8$.

EXAMPLE 4

Figure 45A:
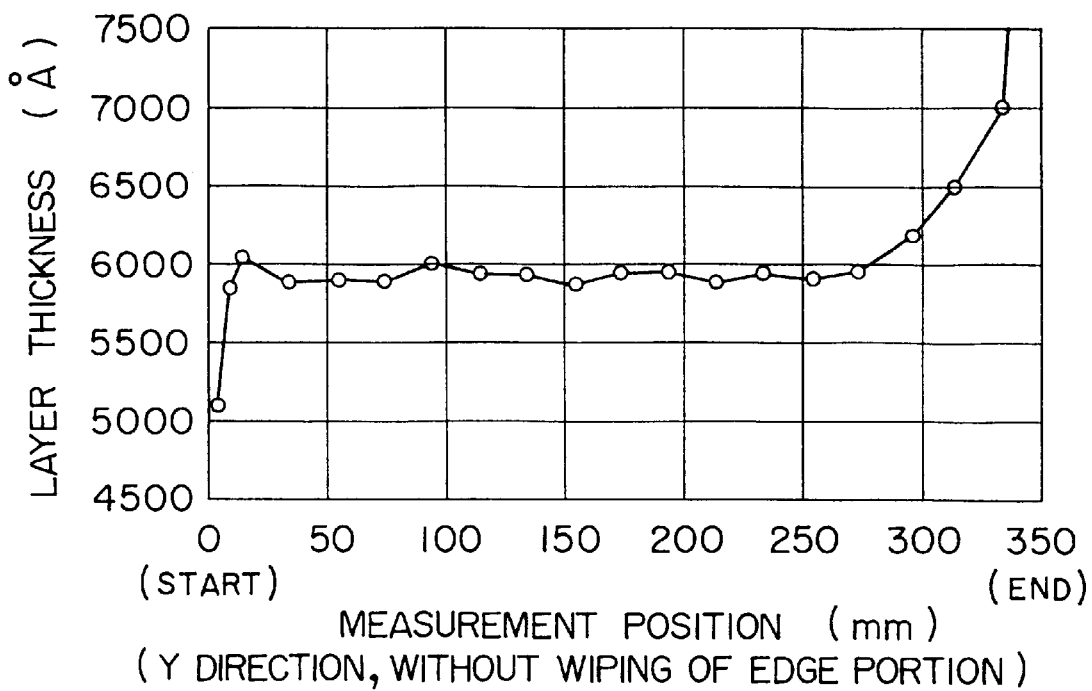
FIG. 45A and FIG. 45B are graphs showing differences in layer thickness distribution due to whether or not excess application liquid bead is removed from the outermost portions of the substrate.
Figure 45B:
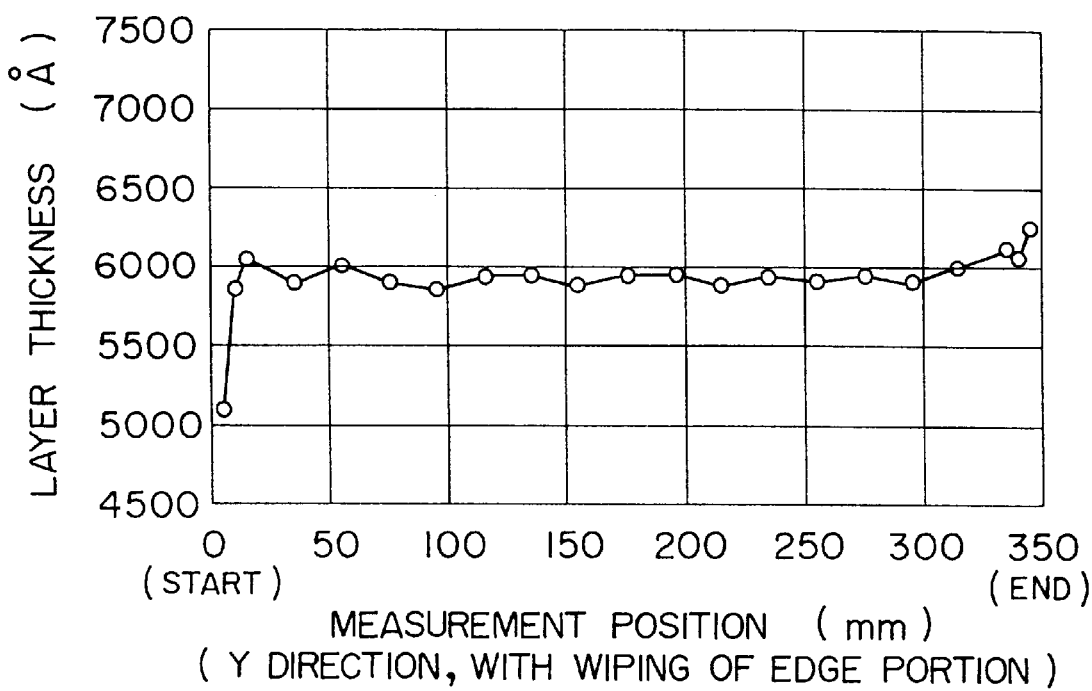

A photosensitive liquid formed of a PVA/diazo group having a viscosity of 8.5 cps and a solids content of 2.5% was used as the application liquid R of Example 1, the angle of inclination θ of the substrate was set to 11 degrees, and the heights $h_1$ and $h_2$ of the menisci $L_1$ and $L_2$ were 0.3 mm and 1.35 mm, respectively. A substrate was moved at a speed of 30 mm/s and the application liquid was applied to the main surface of the substrate as shown in FIG. 7. However, the liquid remaining on the end edge of the substrate after the application was not removed by the above described wiping or suction. As a result, the layer thickness distribution in the Y direction shown in FIG. 45A was obtained. In contrast, an improved layer thickness distribution could be achieved as shown in FIG. 45B as a result of removing the liquid remaining on the end edge of the substrate by the method shown in FIG. 28 to FIG. 30. The ratio of the height $h_2$ of the meniscus $L_2$ with respect to the wet-layer thickness $I_2$ of the application layer Ra in this case was: $I_2:h_2=1:56$.

EXAMPLE 5

A photosensitive liquid formed of a PVA/diazo group having a viscosity of 5.0 cps and a solids content of 1.0% was used as the application liquid R of Example 4, the angle of inclination θ of the substrate was set to 5 degrees, and the heights $h_1$ and $h_2$ of the menisci $L_1$ and $L_2$ were 0.05 mm and 0.26 mm, respectively. A substrate was moved at a speed of 30 mm/s and the application liquid was applied to the main surface of the substrate as shown in FIG. 7. The ratio of the height $h_2$ of the meniscus $L_2$ with respect to the wet-layer thickness $I_2$ of the application layer Ra in this case was: $I_2:h_2=1:5.5$.

As a result, the average layer thickness after drying in this case was 0.47 μm. This was not a good applied state, with a visually confirmable "bumpy" unevenness on the applied surface. Despite processing under the same drying conditions as those of Example 4, unevenness was produced and it was thought that this was due to variations in film thickness that were too great to be leveled until the drying.

INDUSTRIAL APPLICABILITY

Other than glass substrates having non-flexibility, the present invention can be used for forming an applied layer on flexible or non-flexible plastics, metals, and paper.

We claim:

1. A method of applying a liquid comprising the steps of:
    supplying an application liquid through a horizontal linear application supply means of an application head;
    causing a linear application liquid bead to form in a space between the application liquid supply means and a rigid substrate of planar sheet form located adjacent but spaced from said application liquid supply means;
    causing said substrate to move relative to said application liquid bead in an upward direction across a direction in which said application liquid bead extends; and
    bringing said application liquid bead into contact with a planar application surface of said substrate while said application liquid is supplied from said application liquid supply means, to form an application layer on said application surface in accordance with said relative movement of said substrate;
    said liquid application method further comprising the steps of:
    providing said application liquid supply means in an upward-pointing direction;
    determining relative positioning between said substrate and said application head in such a manner that said substrate is positioned in an inclined state wherein said planar application surface is directed downwards toward said application liquid supply means, and forms a constant angle of inclination, before an application of liquid begins, and said application liquid supply means is positioned adjacent to said application surface of the substrate in the vicinity of an uppermost edge thereof;
    producing an upper meniscus of said application liquid bead facing a higher side of said inclined substrate in said space between said application liquid supply means and said substrate, and a lower meniscus of said application liquid bead facing a lower side of said inclined substrate in said space, said upper meniscus having a greater height dimension than said lower meniscus;
    maintaining said upper and lower menisci by physical properties, including viscosity and surface tension, of the application liquid;
    causing said substrate to move along a predetermined linear path relative to said application head while maintaining said angle of inclination relative to said application head in such a manner that said application liquid bead moves towards a lower edge of said substrate while maintaining said inclined state of said substrate and said relation between the menisci of said application liquid; and
    causing the application layer of the application liquid to flow down along said planar application surface towards said lower edge of the substrate, thus smoothing the surface of the application layer.

2. A liquid application method as defined in claim 1, wherein, of menisci formed at said application liquid bead, the height dimension of the meniscus facing the higher side of the inclined substrate is greater than a thickness of the liquid application layer to be formed.

3. A liquid application method as defined in claim 2, wherein said height dimension is at least 20 times the thickness of the liquid application layer to be formed.

4. A liquid application method as defined in claim 2, wherein said height dimension is between ten times and 1000 times the thickness of the liquid application layer to be formed.

5. A liquid application method as defined in claim 1, wherein, when said application liquid bead reaches an application end position adjacent to a lower edge of said substrate, said application liquid bead is removed.

6. A liquid application method as defined in claim 5, wherein said removal of said application liquid bead is achieved by suction.

7. A liquid application method as defined in claim 5, wherein said removal of said application liquid bead is achieved by wiping.

* * * * *